US010428256B2

(12) United States Patent
Shen et al.

(10) Patent No.: US 10,428,256 B2
(45) Date of Patent: Oct. 1, 2019

(54) RELEASABLE THERMAL GEL

(71) Applicant: Honeywell International Inc., Morris Plains, NJ (US)

(72) Inventors: Ling Shen, Shanghai (CN); Kai Zhang, Shanghai (CN); Liqiang Zhang, Shanghai (CN); Ya Qun Liu, Shanghai (CN); Huifeng Duan, Shanghai (CN); Haigang Kang, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/160,478

(22) Filed: Oct. 15, 2018

(65) Prior Publication Data

US 2019/0119544 A1    Apr. 25, 2019

Related U.S. Application Data

(60) Provisional application No. 62/575,915, filed on Oct. 23, 2017.

(51) Int. Cl.
*H05K 7/20* (2006.01)
*H01L 23/34* (2006.01)
(Continued)

(52) U.S. Cl.
CPC ............ *C09K 5/10* (2013.01); *F28F 13/00* (2013.01); *H01L 23/3737* (2013.01);
(Continued)

(58) Field of Classification Search
CPC ........ H05K 7/20; H01L 23/34; H01L 23/373; C08K 3/00; C08K 3/08; C08K 3/22; C08K 3/28; C09K 5/10; C09K 5/14
(Continued)

(56) References Cited

U.S. PATENT DOCUMENTS 1,655,133 A    1/1928  Clase
4,180,498 A   12/1979  Spivack
(Continued)

FOREIGN PATENT DOCUMENTS

CA    2311067 A1    1/2001
CN    1407141 A     4/2003
(Continued)

OTHER PUBLICATIONS

Evonik, Silanes for Adhesives and Sealants, 2013, p. 1-24.
(Continued)

*Primary Examiner* — Xiaoliang Chen
(74) *Attorney, Agent, or Firm* — Faegre Baker Daniels LLP

(57) ABSTRACT

The present disclosure provides a two component releasable thermal gel that is useful in transferring heat from heat generating electronic devices, such as computer chips, to heat dissipating structures, such as heat spreaders and heat sinks. The two component releasable thermal gel is mixed before the point of application and facilitates catalytic cross-linking. The thermal gel includes a first component including a primary silicone oil, an inhibitor, a catalyst, and at least one thermally conductive filler, and a second component including a primary silicone oil, a cross linking silicone oil, and at least one thermally conductive filler, wherein the ratio of total content of Si—H groups to total content of vinyl groups in the thermal gel is between 0.03 to 10. The thermal gel is releasable from a substrate upon which the thermal gel is applied.

20 Claims, 6 Drawing Sheets

(51) Int. Cl.
*H01L 23/373* (2006.01)
*C08K 3/00* (2018.01)
*C08K 3/08* (2006.01)
*C08K 3/22* (2006.01)
*C08K 3/28* (2006.01)
*C09K 5/10* (2006.01)
*C09K 5/14* (2006.01)
*F28F 13/00* (2006.01)
*H05K 1/02* (2006.01)
*H01L 23/00* (2006.01)
*H01L 23/42* (2006.01)

(52) U.S. Cl.
CPC .............. *H01L 23/42* (2013.01); *H01L 24/27* (2013.01); *H01L 24/29* (2013.01); *H01L 24/32* (2013.01); *H05K 1/0203* (2013.01); *F28F 2013/006* (2013.01); *H01L 23/373* (2013.01); *H01L 23/3732* (2013.01); *H01L 23/3736* (2013.01); *H01L 2224/29291* (2013.01); *H01L 2224/32245* (2013.01); *H05K 2201/0162* (2013.01); *H05K 2201/066* (2013.01); *H05K 2201/10015* (2013.01); *H05K 2201/10022* (2013.01)

(58) Field of Classification Search
USPC ......... 361/708, 712; 257/706, 712; 524/430, 524/439, 588
See application file for complete search history.

(56) References Cited

U.S. PATENT DOCUMENTS

| | | | |
|---|---|---|---|
| 4,265,026 A | 5/1981 | Meyer | |
| 4,446,266 A | 5/1984 | von Gentzkow et al. | |
| 4,459,185 A | 7/1984 | Obata et al. | |
| 4,565,610 A | 1/1986 | Nobel et al. | |
| 4,604,424 A | 8/1986 | Cole et al. | |
| 5,162,555 A | 11/1992 | Remmers et al. | |
| 5,167,851 A | 12/1992 | Jamison et al. | |
| 5,403,580 A | 4/1995 | Bujanowski et al. | |
| 5,562,814 A | 10/1996 | Kirby | |
| 6,040,362 A | 3/2000 | Mine et al. | |
| 6,096,414 A | 8/2000 | Young | |
| 6,238,596 B1 | 5/2001 | Nguyen et al. | |
| 6,339,120 B1 | 1/2002 | Misra et al. | |
| 6,372,337 B2 | 4/2002 | Takahashi et al. | |
| 6,372,997 B1 | 4/2002 | Hill et al. | |
| 6,391,442 B1 | 5/2002 | Duvall et al. | |
| 6,400,565 B1 | 6/2002 | Shabbir et al. | |
| 6,432,320 B1 | 8/2002 | Bonsignore et al. | |
| 6,432,497 B2 | 8/2002 | Bunyan | |
| 6,451,422 B1 | 9/2002 | Nguyen | |
| 6,475,962 B1 | 11/2002 | Khatri | |
| 6,496,373 B1 | 12/2002 | Chung | |
| 6,500,891 B1 | 12/2002 | Kropp et al. | |
| 6,562,180 B1 | 5/2003 | Bohin et al. | |
| 6,597,575 B1 | 7/2003 | Matayabas et al. | |
| 6,605,238 B2 | 8/2003 | Nguyen et al. | |
| 6,610,635 B2 | 8/2003 | Khatri | |
| 6,616,999 B1 | 9/2003 | Freuler et al. | |
| 6,617,517 B2 | 9/2003 | Hill et al. | |
| 6,620,515 B2 | 9/2003 | Feng et al. | |
| 6,624,224 B1 | 9/2003 | Misra | |
| 6,649,325 B1 | 11/2003 | Gundale et al. | |
| 6,657,297 B1 | 12/2003 | Jewram et al. | |
| 6,673,434 B2 | 1/2004 | Nguyen | |
| 6,706,219 B2 | 3/2004 | Nguyen | |
| 6,761,928 B2 | 7/2004 | Hill et al. | |
| 6,764,759 B2 | 7/2004 | Duvall et al. | |
| 6,783,692 B2 | 8/2004 | Bhagwagar | |
| 6,791,839 B2 | 9/2004 | Bhagwagar | |
| 6,797,382 B2 | 9/2004 | Nguyen et al. | |
| 6,797,758 B2 | 9/2004 | Misra et al. | |
| 6,811,725 B2 | 11/2004 | Nguyen et al. | |
| 6,815,486 B2 | 11/2004 | Bhagwagar et al. | |
| 6,835,453 B2 | 12/2004 | Greenwood et al. | |
| 6,838,182 B2 | 1/2005 | Kropp et al. | |
| 6,874,573 B2 | 4/2005 | Collins et al. | |
| 6,900,163 B2 | 5/2005 | Khatri | |
| 6,908,669 B2 | 6/2005 | Nguyen | |
| 6,908,682 B2 | 6/2005 | Mistele | |
| 6,913,686 B2 | 7/2005 | Hilgarth | |
| 6,926,955 B2 | 8/2005 | Jayaraman et al. | |
| 6,940,721 B2 | 9/2005 | Hill | |
| 6,946,190 B2 | 9/2005 | Bunyan | |
| 6,975,944 B1 | 12/2005 | Zenhausern | |
| 6,984,685 B2 | 1/2006 | Misra et al. | |
| 7,013,965 B2 | 3/2006 | Zhong et al. | |
| 7,056,566 B2 | 6/2006 | Freuler et al. | |
| 7,074,490 B2 | 7/2006 | Feng et al. | |
| 7,078,109 B2 | 7/2006 | Hill et al. | |
| 7,135,232 B2 | 11/2006 | Yamada et al. | |
| 7,147,367 B2 | 12/2006 | Balian et al. | |
| 7,172,711 B2 | 2/2007 | Nguyen | |
| 7,241,707 B2 | 7/2007 | Meagley et al. | |
| 7,244,491 B2 | 7/2007 | Nguyen | |
| 7,291,396 B2 | 11/2007 | Huang et al. | |
| 7,294,394 B2 | 11/2007 | Jayaraman et al. | |
| RE39,992 E | 1/2008 | Misra et al. | |
| 7,328,547 B2 | 2/2008 | Mehta et al. | |
| 7,369,411 B2 | 5/2008 | Hill et al. | |
| 7,462,294 B2 | 12/2008 | Kumar et al. | |
| 7,465,605 B2 | 12/2008 | Raravikar et al. | |
| 7,538,075 B2 | 5/2009 | Yamada et al. | |
| 7,550,097 B2 | 6/2009 | Tonapi et al. | |
| 7,572,494 B2 | 8/2009 | Mehta et al. | |
| 7,641,811 B2 | 1/2010 | Kumar et al. | |
| 7,682,690 B2 | 3/2010 | Bunyan et al. | |
| 7,695,817 B2 | 4/2010 | Lin et al. | |
| 7,700,943 B2 | 4/2010 | Raravikar et al. | |
| 7,744,991 B2 | 6/2010 | Fischer et al. | |
| RE41,576 E | 8/2010 | Bunyan et al. | |
| 7,816,785 B2 | 10/2010 | Iruvanti et al. | |
| 7,846,778 B2 | 12/2010 | Rumer et al. | |
| 7,850,870 B2 | 12/2010 | Ahn et al. | |
| 7,867,609 B2 | 1/2011 | Nguyen | |
| 7,955,900 B2 | 6/2011 | Jadhav et al. | |
| 7,960,019 B2 | 6/2011 | Jayaraman et al. | |
| 8,039,961 B2 | 10/2011 | Suhir et al. | |
| 8,076,773 B2 | 12/2011 | Jewram et al. | |
| 8,081,468 B2 | 12/2011 | Hill et al. | |
| 8,105,504 B2 | 1/2012 | Gerster et al. | |
| 8,110,919 B2 | 2/2012 | Jewram et al. | |
| 8,138,239 B2 | 3/2012 | Prack et al. | |
| 8,223,498 B2 | 7/2012 | Lima | |
| 8,308,861 B2 | 11/2012 | Rolland et al. | |
| 8,324,313 B2 | 12/2012 | Funahashi | |
| 8,373,283 B2 | 2/2013 | Masuko et al. | |
| 8,431,647 B2 | 4/2013 | Dumont et al. | |
| 8,431,655 B2 | 4/2013 | Dershem | |
| 8,445,102 B2 | 5/2013 | Strader et al. | |
| 8,518,302 B2 | 8/2013 | Gerster et al. | |
| 8,535,478 B2 | 9/2013 | Pouchelon et al. | |
| 8,535,787 B1 | 9/2013 | Lima | |
| 8,557,896 B2 | 10/2013 | Jeong et al. | |
| 8,586,650 B2 | 11/2013 | Zhang et al. | |
| 8,587,945 B1 | 11/2013 | Hartmann et al. | |
| 8,618,211 B2 | 12/2013 | Bhagwagar et al. | |
| 8,632,879 B2 | 1/2014 | Weisenberger | |
| 8,633,478 B2 | 1/2014 | Cummings et al. | |
| 8,638,001 B2 | 1/2014 | Kimura et al. | |
| 8,647,752 B2 | 2/2014 | Strader et al. | |
| 8,758,892 B2 | 6/2014 | Bergin et al. | |
| 8,796,068 B2 | 8/2014 | Stender et al. | |
| 8,837,151 B2 | 9/2014 | Hill et al. | |
| 8,865,800 B2 | 10/2014 | Stammer et al. | |
| 8,917,510 B2 | 12/2014 | Boday et al. | |
| 8,937,384 B2 | 1/2015 | Bao et al. | |
| 9,055,694 B2 | 6/2015 | Lima | |
| 9,070,660 B2 | 6/2015 | Lowe et al. | |
| 9,080,000 B2 | 7/2015 | Ahn et al. | |
| 9,222,735 B2 | 12/2015 | Hill et al. | |

(56) References Cited

U.S. PATENT DOCUMENTS

| | | |
|---|---|---|
| 9,260,645 B2 | 2/2016 | Bruzda |
| 9,392,730 B2 | 7/2016 | Hartmann et al. |
| 9,481,851 B2 | 11/2016 | Matsumoto et al. |
| 9,527,988 B2 | 12/2016 | Habimana et al. |
| 9,537,095 B2 | 1/2017 | Stender et al. |
| 9,593,209 B2 | 3/2017 | Dent et al. |
| 9,593,275 B2 | 3/2017 | Tang et al. |
| 9,598,575 B2 | 3/2017 | Bhagwagar et al. |
| 10,155,894 B2 | 12/2018 | Liu et al. |
| 10,287,471 B2 | 5/2019 | Zhang et al. |
| 10,312,177 B2 | 6/2019 | Zhang et al. |
| 2002/0018885 A1 | 2/2002 | Takahashi et al. |
| 2002/0132896 A1 | 9/2002 | Nguyen |
| 2002/0140082 A1* | 10/2002 | Matayabas ............ C08K 3/08 257/706 |
| 2002/0143092 A1* | 10/2002 | Matayabas, Jr. ........ C08L 83/00 524/439 |
| 2003/0112603 A1 | 6/2003 | Roesner et al. |
| 2003/0128521 A1 | 7/2003 | Matayabas et al. |
| 2003/0151030 A1 | 8/2003 | Gurin |
| 2003/0159938 A1 | 8/2003 | Hradil |
| 2003/0171487 A1* | 9/2003 | Ellsworth ............... C08J 5/18 524/588 |
| 2003/0203181 A1 | 10/2003 | Ellsworth et al. |
| 2003/0207064 A1 | 11/2003 | Bunyan et al. |
| 2003/0207128 A1 | 11/2003 | Uchiya et al. |
| 2003/0230403 A1 | 12/2003 | Webb |
| 2004/0069454 A1 | 4/2004 | Bonsignore et al. |
| 2004/0097635 A1 | 5/2004 | Fan et al. |
| 2004/0149587 A1 | 8/2004 | Hradil |
| 2004/0161571 A1 | 8/2004 | Duvall et al. |
| 2004/0206941 A1 | 10/2004 | Gurin |
| 2005/0020738 A1 | 1/2005 | Jackson et al. |
| 2005/0025984 A1 | 2/2005 | Odell et al. |
| 2005/0045855 A1* | 3/2005 | Tonapi ................ C09K 5/14 252/500 |
| 2005/0072334 A1 | 4/2005 | Czubarow et al. |
| 2005/0148721 A1 | 7/2005 | Tonapi et al. |
| 2005/0228097 A1 | 10/2005 | Zhong |
| 2005/0287362 A1 | 12/2005 | Garcia-Ramirez et al. |
| 2006/0057364 A1 | 3/2006 | Nguyen |
| 2006/0094809 A1 | 5/2006 | Simone et al. |
| 2006/0122304 A1* | 6/2006 | Matayabas, Jr. ........ C08L 83/00 524/430 |
| 2006/0208354 A1 | 9/2006 | Liu et al. |
| 2006/0228542 A1 | 10/2006 | Czubarow |
| 2006/0260948 A2 | 11/2006 | Zschintzsch et al. |
| 2006/0264566 A1 | 11/2006 | Cassar et al. |
| 2007/0051773 A1 | 3/2007 | Ruchert et al. |
| 2007/0097651 A1 | 5/2007 | Canale et al. |
| 2007/0131913 A1 | 6/2007 | Cheng et al. |
| 2007/0161521 A1 | 7/2007 | Sachdev et al. |
| 2007/0164424 A1 | 7/2007 | Dean et al. |
| 2007/0179232 A1 | 8/2007 | Collins et al. |
| 2007/0249753 A1 | 10/2007 | Lin et al. |
| 2008/0044670 A1 | 2/2008 | Nguyen |
| 2008/0116416 A1 | 5/2008 | Chacko |
| 2008/0141629 A1 | 6/2008 | Alper et al. |
| 2008/0149176 A1 | 6/2008 | Sager et al. |
| 2008/0291634 A1* | 11/2008 | Weiser ................ C09K 5/14 361/708 |
| 2008/0302064 A1 | 12/2008 | Rauch |
| 2009/0111925 A1 | 4/2009 | Burnham et al. |
| 2009/0184283 A1 | 7/2009 | Chung et al. |
| 2010/0048435 A1 | 2/2010 | Yamagata et al. |
| 2010/0048438 A1 | 2/2010 | Carey et al. |
| 2010/0075135 A1 | 3/2010 | Kendall et al. |
| 2010/0129648 A1 | 5/2010 | Xu et al. |
| 2010/0197533 A1 | 8/2010 | Kendall et al. |
| 2011/0121435 A1 | 5/2011 | Mitsukura et al. |
| 2011/0141698 A1 | 6/2011 | Chiou et al. |
| 2011/0187009 A1 | 8/2011 | Masuko et al. |
| 2011/0192564 A1* | 8/2011 | Mommer ............ H01M 2/1094 165/10 |
| 2011/0204280 A1 | 8/2011 | Bruzda |
| 2011/0265979 A1 | 11/2011 | Chen et al. |
| 2011/0294958 A1 | 12/2011 | Ahn et al. |
| 2011/0308782 A1 | 12/2011 | Merrill et al. |
| 2012/0060826 A1 | 3/2012 | Weisenberger |
| 2012/0195822 A1 | 8/2012 | Werner et al. |
| 2012/0253033 A1 | 10/2012 | Boucher et al. |
| 2012/0285673 A1 | 11/2012 | Cola et al. |
| 2012/0288725 A1 | 11/2012 | Tanaka et al. |
| 2013/0199724 A1 | 8/2013 | Dershem |
| 2013/0248163 A1 | 9/2013 | Bhagwagar et al. |
| 2013/0265721 A1 | 10/2013 | Strader et al. |
| 2013/0288462 A1 | 10/2013 | Stender et al. |
| 2013/0299140 A1 | 11/2013 | Ling et al. |
| 2014/0190672 A1 | 7/2014 | Swaroop et al. |
| 2014/0264818 A1* | 9/2014 | Lowe, Jr. ............ H01L 23/3737 257/712 |
| 2015/0125646 A1 | 5/2015 | Tournilhac et al. |
| 2015/0138739 A1 | 5/2015 | Hishiki |
| 2015/0158982 A1 | 6/2015 | Saito et al. |
| 2015/0183951 A1 | 7/2015 | Bhagwagar et al. |
| 2015/0275060 A1 | 10/2015 | Kuroda et al. |
| 2015/0279762 A1* | 10/2015 | Lowe ................ H01L 23/3737 257/712 |
| 2016/0160102 A1 | 6/2016 | Minegishi et al. |
| 2016/0160104 A1 | 6/2016 | Bruzda et al. |
| 2016/0226114 A1 | 8/2016 | Hartmann et al. |
| 2016/0272839 A1 | 9/2016 | Yamamoto et al. |
| 2017/0009362 A1 | 1/2017 | Werner et al. |
| 2017/0107415 A1 | 4/2017 | Shiono |
| 2017/0137685 A1 | 5/2017 | Liu et al. |
| 2017/0167716 A1 | 6/2017 | Ezaki et al. |
| 2017/0226396 A1 | 8/2017 | Yang et al. |
| 2017/0317257 A1 | 11/2017 | Ezaki et al. |
| 2017/0321100 A1 | 11/2017 | Zhang et al. |
| 2018/0030327 A1* | 2/2018 | Zhang ................ C08K 3/22 |
| 2018/0030328 A1* | 2/2018 | Zhang ................ C08L 83/04 |
| 2018/0085977 A1 | 3/2018 | Ezaki |
| 2018/0194982 A1 | 7/2018 | Ezaki et al. |
| 2018/0267315 A1 | 9/2018 | Yonemura |
| 2018/0358283 A1 | 12/2018 | Zhang et al. |
| 2018/0370189 A1* | 12/2018 | Tang ................ B32B 15/08 |
| 2019/0048245 A1 | 2/2019 | Liu et al. |
| 2019/0078007 A1 | 3/2019 | Zhang et al. |
| 2019/0085225 A1 | 3/2019 | Zhang et al. |
| 2019/0092993 A1* | 3/2019 | Naik ................ C09K 5/10 |

FOREIGN PATENT DOCUMENTS

| | | |
|---|---|---|
| CN | 1456710 A | 11/2003 |
| CN | 1549875 A | 11/2004 |
| CN | 1970666 A | 5/2007 |
| CN | 101067030 A | 11/2007 |
| CN | 101090922 B | 12/2007 |
| CN | 101445627 A | 6/2009 |
| CN | 101525489 A | 9/2009 |
| CN | 101735619 B | 6/2010 |
| CN | 101835830 B | 9/2010 |
| CN | 101942197 A | 1/2011 |
| CN | 102134474 B | 7/2011 |
| CN | 102341474 B | 2/2012 |
| CN | 102627943 A | 8/2012 |
| CN | 102634212 A | 8/2012 |
| CN | 102348763 B | 4/2013 |
| CN | 103087389 A | 5/2013 |
| CN | 103102552 A | 5/2013 |
| CN | 103102689 A | 5/2013 |
| CN | 103131138 B | 6/2013 |
| CN | 103214848 A | 7/2013 |
| CN | 103254647 A | 8/2013 |
| CN | 103333447 A | 10/2013 |
| CN | 103409116 B | 11/2013 |
| CN | 103436027 B | 12/2013 |
| CN | 103709757 A | 4/2014 |
| CN | 103756631 A | 4/2014 |
| CN | 103773322 A | 5/2014 |
| CN | 103849356 A | 6/2014 |
| CN | 103865271 B | 6/2014 |
| CN | 103923463 B | 7/2014 |

(56) References Cited

FOREIGN PATENT DOCUMENTS

| | | |
|---|---|---|
| CN | 104098914 A | 10/2014 |
| CN | 104140678 B | 11/2014 |
| CN | 104152103 A | 11/2014 |
| CN | 104449550 A | 3/2015 |
| CN | 104497574 A | 4/2015 |
| CN | 104513487 A | 4/2015 |
| CN | 104804705 A | 7/2015 |
| CN | 104861661 A | 8/2015 |
| CN | 105111750 A | 12/2015 |
| CN | 105349113 A | 2/2016 |
| CN | 105419339 A | 3/2016 |
| CN | 104479623 B | 5/2016 |
| CN | 105566920 A | 5/2016 |
| CN | 105670555 A | 6/2016 |
| CN | 105838322 A | 8/2016 |
| CN | 105925243 A | 9/2016 |
| CN | 105980512 A | 9/2016 |
| CN | 106221236 A | 12/2016 |
| CN | 106243720 A | 12/2016 |
| CN | 107057370 A | 8/2017 |
| EP | 1224669 B1 | 7/2002 |
| EP | 1149519 B1 | 11/2004 |
| EP | 1514956 B1 | 3/2005 |
| EP | 1629059 B1 | 3/2006 |
| EP | 2194165 A1 | 6/2010 |
| FR | 2848215 A1 | 6/2004 |
| GB | 2508320 B | 5/2014 |
| JP | 57027188 B | 6/1982 |
| JP | 0543116 B2 | 5/1986 |
| JP | 3662715 B2 | 1/1991 |
| JP | 02611364 B2 | 5/1997 |
| JP | 2000143808 A | 5/2000 |
| JP | 2001139818 A | 5/2001 |
| JP | 2002003830 A | 1/2002 |
| JP | 100479857 B1 | 7/2003 |
| JP | 2007002002 A | 1/2007 |
| JP | 4016326 B2 | 12/2007 |
| JP | 2008063412 A | 3/2008 |
| JP | 5269366 B2 | 3/2009 |
| JP | 2009102577 A | 5/2009 |
| JP | 5137538 B2 | 6/2009 |
| JP | 2009138036 A | 6/2009 |
| JP | 4288469 B2 | 7/2009 |
| JP | 5607298 B2 | 3/2010 |
| JP | 5390202 B2 | 8/2010 |
| JP | 2010248277 A | 11/2010 |
| JP | 2010278115 A | 12/2010 |
| JP | 5318733 B2 | 6/2011 |
| JP | 2011165792 A | 8/2011 |
| JP | 5687167 B2 | 4/2013 |
| JP | 5463116 B2 | 4/2014 |
| JP | 2014105283 A | 6/2014 |
| JP | 5944306 B2 | 7/2014 |
| JP | 5372270 B1 | 9/2014 |
| JP | 2014194006 A | 10/2014 |
| KR | 20070116654 A | 12/2007 |
| TW | 200907040 A | 2/2009 |
| TW | 201527309 A | 7/2015 |
| WO | 1997026297 A1 | 7/1997 |
| WO | WO0120618 A1 | 3/2001 |
| WO | 03052818 A1 | 6/2003 |
| WO | 2003064148 A1 | 8/2003 |
| WO | 2004008497 A2 | 1/2004 |
| WO | 2004022330 A1 | 3/2004 |
| WO | 2005021257 A1 | 3/2005 |
| WO | 200511146 A1 | 11/2005 |
| WO | 2005119771 A1 | 12/2005 |
| WO | 2006023860 A2 | 3/2006 |
| WO | 2007027670 A1 | 3/2007 |
| WO | 2008014171 A2 | 1/2008 |
| WO | 2008103219 A1 | 8/2008 |
| WO | 2008121491 A1 | 10/2008 |
| WO | 2008121970 A1 | 10/2008 |
| WO | 2009032212 A1 | 3/2009 |
| WO | 2013191116 A1 | 12/2013 |
| WO | 2014007119 A1 | 1/2014 |
| WO | 2014160067 A1 | 10/2014 |
| WO | 2015179056 A1 | 11/2015 |
| WO | 2016004565 A1 | 1/2016 |
| WO | 2016103424 A1 | 6/2016 |
| WO | WO2018068222 A1 | 4/2018 |

OTHER PUBLICATIONS

International Preliminary Report on Patentability issued in PCT/CN2016/075827, dated Sep. 20, 2018, 5 pages.
International Search Report and Written Opinion issued in PCT/CN2016/075827, dated Dec. 1, 2016, 7 pages.
International Search Report and Written Opinion issued in PCT/US2018/049218, dated Dec. 28, 2018, 13 pages.
International Search Report and Written Opinion issued in PCT/US2018/056870, dated Feb. 8, 2019, 9 pages.
Singaporean Written Opinion issued in SG Application No. 11201704238Y, completed Feb. 7, 2019, 7 pages.
Wacker Silicones, Catalyst EP/Inhibitor PT 88 product data sheet, p. 1-3, Oct. 6, 2008.
"Dynasylan 1146: Oligomeric Diamino-Silane-System" Evonik Industries, pp. 1-3, 2008.
"Hi-Flow 225F-AC Reinforced, Phase Change Thermal Interface Material," The Bergquist Company, 1 page, available at least as early as Aug. 31, 2017.
"Semicosil 9212A." Wacker Silicones Material Safety Data Sheet, pp. 1-8, printed Dec. 11, 2009.
"Semicosil 9212B." Wacker Silicones Material Safety Data Sheet, pp. 1-8, printed Dec. 11, 2009.
"THERM-A-GAP HCS 10,569,570,579 and 580 Thermally Conductive Gap Filler Pads," Parker Chomerics, Engineering Your Success, pp. 11-12, available at least as early as the filing date of the present application.
Aranzabe, Estibaliz, et al. "More than Color: Pigments with Thermal Storage Capacity; Processing and Degradation Behavior." Advances in Materials Physics and Chemistry, 5:171-184, 2015.
Dow Corning® Two-Part RTV Silicone Sealant: Total Assembly Solutions for Home Appliance Production; www.dowcorning.com; Form No. 80-3375-01; 6 pages.
Extended European Search Report issued in EP Application 14867847.7, dated Jun. 26, 2017, 7 pages.
Extended European Search Report issued in EP Application No. 14897036.1, dated Jul. 2, 2018, 7 pages.
Extended Search Report issued in EP Application 14907530.1, dated Jun. 27, 2018, 9 pages.
Fink, Johannes Karl. "Chapter 18: Metal Deactivators." in: A Concise Introduction to Additives for Thermoplastic Polymers, Wiley-Scrivener, pp. 165-171, Jan. 1, 2010.
Gowda, Arun, et al. "Choosing the Right Thermal Interface Material." Solid State Technology, Insights for Electronics Manufacturing, Online Blog, 9 pages, 2005. Retrieved May 25, 2017 from the Internet <http://electroiq.com/blog/2005/03/choosing-the-right-thermal-interface-material/.
International Search Report and Written Opinion issued in PCT/CN2014/081724. dated Apr. 1, 2015, 12 pages.
International Search Report and Written Opinion issued in PCT/CN2014/093138, dated Sep. 6, 2015, 8 pages.
International Search Report and Written Opinion issued in PCT/CN2016/101874, dated Apr. 28, 2017, 12 pages.
International Search Report and Written Opinion issued in PCT/US2014/068033, dated Mar. 26, 2015, 12 pages.
International Search Report and Written Opinion issued in PCT/US2017/041498, dated Oct. 20, 2017, 10 pages.
Martyak et al., On the oxidation of tin(II) in methanesulfonate solutions and the role of sulfate, Galvanotechnik (2005), 96(3), 594-601 (Abstract).
Ping, Ding, et al. "Preparation and Application Research of Novel Silicone Gel for High-Power IGBT." Insulating Materials, 47(2):52-55, Chinese text with English translation of Abstract, 2014.
Ramaswamy, C., et al. "Phase Change Materials as a Viable Thermal Interface Material for High-Power Electronic Applications." The Ninth Intersociety Conference on Thermal and

(56) References Cited

OTHER PUBLICATIONS

Thermomechanical Phenomena in Electronic Systems, IEEE, 2:687-691, 2004.
Search Report issued in CN application 201480066502.2, dated May 18, 2017, 2 pages.
Singaporean Search Report and Written Opinion issued in SG Application No. 11201704238Y, completed May 18, 2018, 9 pages.
Yasuhiro Aoyagi et al., "Effects of antioxidants and the solild component on the thermal stability of polyol-ester-based thermal pastes", J Mater Sci (2007) 42:2358-2375; Mar. 12, 2007.
Yasuhiro Aoyagi et al., "Polyol-Based Phase-Change Thermal Interface Materials", Journal of Electronic Materials, vol. 35, No. 3, (2006); pp. 416-424.
Yunsheng Xu et al., "Lithium Doped Polyethylene-Glycol-Based Thermal Interface Pastes for High Thermal Contact Conductance", Transactions of the ASME; Journal of Electronic Packagiing, vol. 124, Sep. 2002; pp. 188-191.

* cited by examiner

RELEASABLE THERMAL GEL

CROSS-REFERENCE TO RELATED APPLICATION

This application claims priority to Provisional Application No. 62/575,915, filed Oct. 23, 2017, which is herein incorporated by reference in its entirety.

FIELD OF THE INVENTION

The present disclosure relates generally to thermal gels, and more particularly to a two component thermal gel.

DESCRIPTION OF THE RELATED ART

Thermal interface materials (TIMs) and thermal gels are widely used to dissipate heat from electronic components, such as central processing units, video graphics arrays, servers, game consoles, smart phones, LED boards, and the like. Thermal interface materials are typically used to transfer excess heat from the electronic component to a heat spreader, such as a heat sink.

In the electronics industry, it is desired to minimize the size of the final device. This means that the size of a printed circuit board (PCB) also needs to decrease, leading to a requirement for a greater number of semiconductor chips on a smaller, compact area of the PCB. In some of these applications, a mono-heatsink may be used to cover multi-chips for heat dissipation purposes and reducing assembly costs. However, there are challenges in assembling a heatsink on a chip(s) with limited available space on the chip.

Different chips may have different heights on a common PCB due to variations in their respective assemblies. This means that there will be different gaps between the upper surfaces of the different chips and the heatsink, i.e., a common lowest board line thickness (BLT) cannot be achieved for all chips.

In general, thermal gels are applied onto a printed circuit board (PCB) that includes one or more chips on its surface. Many thermal gels are single component systems in which the components are mixed together prior to shipment, storage, and use. The thermal gels fill the gaps between the chips such that a level surface is provided onto which a heat sink may be applied. However, because of the dense layout of the chips, it is a challenge to remove the residue of the thermal gel between interval gaps of the chips if rework or reapplication of the thermal gel is needed. Additionally, to achieve a high thermal dissipation connection, high thermal conductivity of the thermal gel is needed. Moreover, to cure the thermal gel, heat needs to be applied, which could alter the functionality of the chips and/or PCB.

Improved thermal gels which provide easier handling, room temperature curing, high conductivity and low adhesion for releasability without residue are desired.

SUMMARY OF THE INVENTION

The present disclosure provides a two component releasable thermal gel that is useful in transferring heat from heat generating electronic devices, such as computer chips, to heat dissipating structures, such as heat spreaders and heat sinks. The two component releasable thermal gel is mixed before the point of application and facilitates catalytic cross-linking. The thermal gel includes a first component including a primary silicone oil, an inhibitor, a catalyst, and at least one thermally conductive filler, and a second component including a primary silicone oil, a cross linking silicone oil, and at least one thermally conductive filler, wherein the thermal gel is releasable from a substrate upon which the thermal gel is applied. To increase the releasability of the thermal gel, the ratio of total content Si—H groups to total content of vinyl groups in thermal gel is controlled in range of 0.03 to 10.

In one exemplary embodiment, a thermal gel is provided. The thermal gel includes: a first component including: a primary silicone oil; an inhibitor; a catalyst; and at least one thermal conductive filler; a second component including: a primary silicone oil; a cross linking silicone oil; and at least one thermal conductive filler; wherein the primary silicone oil of the first component is a vinyl silicone oil, the primary silicone oil of the second component is a vinyl silicone oil, and the cross linking second silicone oil of the second component is a hydrosilicone oil; and wherein the thermal gel is releasable from a substrate upon which the thermal gel is applied. In a more particular embodiment, the thermal gel cures in place at room temperature.

In a more particular embodiment, the at least one thermally conductive filler for the first component has an average particle size between 5 microns and 80 microns. In another more particular embodiment, the at least one thermally conductive filler for the first component includes a first thermally conductive filler between 20 wt. % and 25 wt. % having an average particle size of 70 microns; and a second thermally conductive filler between 20 wt. % and 25 wt. % having an average particle size of 5 microns. In another more particular embodiment, the ratio of total content of Si—H groups to total content of vinyl groups is between 0.03 to 10. In another more particular embodiment, the concentration of the catalyst in the thermal gel is greater than 100 ppm.

In still another more particular embodiment, the weight ratio between the first component and the second component is between 0.5:1 and 2:1. In still another more particular embodiment, the primary silicone oil of the first component and the second component each have a kinematic viscosity greater than 1000 cSt. In still another more particular embodiment, the thermal gel cures at a temperature between room temperature and 100° C. In a more particular embodiment of any of the above embodiments, the viscosity of the first component is at least 100 Pa·s, and the viscosity of the second component is at least 100 Pa·s. In another more particular embodiment, the conductivity of the thermal gel is at least 2 W/m.K. In a more particular embodiment of any of the above embodiments, the catalyst is Pt based catalyst with at least 2000 ppm weight loading in first component.

In another exemplary embodiment, a method of preparing a thermal gel is provided. The method includes: preparing a first component, wherein the preparing step includes: adding a silicone oil, an inhibitor, and a catalyst to a reaction vessel to form a mixture and agitating the mixture at a first rate; adding a first thermally conductive filler to the reaction vessel and agitating the mixture at a second rate; adding a second thermally conductive filler to the reaction vessel and agitating the mixture at a third rate; applying a vacuum to the reaction vessel and agitating the mixture at a fourth rate; removing the vacuum from the reaction vessel and transferring the mixture to a discharger; compressing the mixture into a syringe; preparing a second component, wherein the preparing step includes: adding a first silicone oil and a second silicone oil to a second reaction vessel to form a second mixture and agitating the second mixture at a sixth rate; adding a first thermally conductive filler to the second reaction vessel and agitating the mixture at a seventh rate;

adding a second thermally conductive filler to the second reaction vessel and agitating the mixture at an eighth rate; applying a vacuum to the second reaction vessel and agitating the mixture at a ninth rate; removing the vacuum from the second reaction vessel and transferring the mixture to a second discharger; and compressing the mixture into the syringe.

In a more particular embodiment, the method further comprises applying a vacuum to the discharger to remove the air in the mixture.

In another exemplary embodiment, an electronic device is provided. The electronic device includes: (I) at least two heat sources; (II) a thermal conductive composite, cured from a thermal gel and applied onto the at least two heat sources comprising: a first component including: a silicone oil; an inhibitor; a catalyst; and at least one thermal conductive filler; a second component including: a first silicone oil; a second silicone oil; at least one thermal conductive filler; wherein the silicone oil of the first component is a vinyl silicone oil, the first silicone oil of the second component is a vinyl silicone oil, and the second silicone oil of the second component is a hydrosilicone oil; and (III) a heatsink or heat spreader applied onto the thermal conductive composite.

In a more particular embodiment of any of the above embodiments, the ratio of total content of Si—H groups to total content of vinyl groups in the thermal gel is between 0.03 to 10. In a more particular embodiment of any of the above embodiments, the thermal conductive composite is cured at room temperature from the gel. In a more particular embodiment of any of the above embodiments, the thermal conductive composite is cured at room temperature to 100° C. from the gel. In a more particular embodiment, the at least two heat sources include a chip die, or heat spreader covered chip, or chip die on PCB, or heat spreader covered chip on PCB, or capacitor on PCB, or resistor on PCB, or printed circuit on PCB, or the combine thereof. In one exemplary embodiment, the thermal conductive composite remove residue-free on heat source.

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION

A. Thermal Gel

Figure 1:
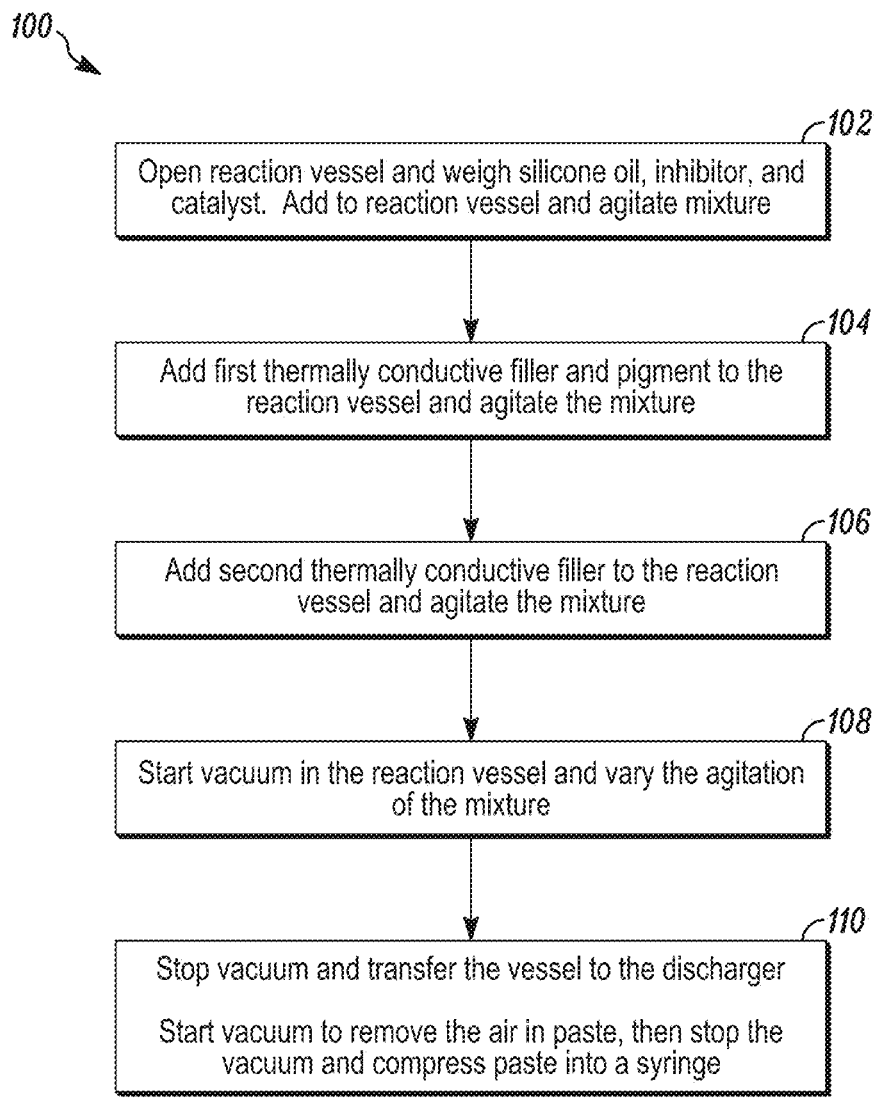
FIG. 1 is a flowchart relating to a method of preparing a first component of the thermal gel.

The present disclosure provides a two component releasable thermal gel that is useful in transferring heat from heat generating electronic devices, such as computer chips, to heat dissipating structures, such as heat spreaders and heat sinks. The two component releasable thermal gel is mixed before the point of application and facilitates catalytic cross-linking. The thermal gel includes a first component including a primary silicone oil, an inhibitor, a catalyst, and at least one thermally conductive filler, and a second component including a primary silicone oil, a cross linking silicone oil, and at least one thermally conductive filler, wherein the thermal gel is releasable from a substrate upon which the thermal gel is applied.

1. First Component

In some exemplary embodiments, the first component of the thermal gel as described below has a viscosity of as little as at least 50 Pa·s, at least 75 Pa·s, at least 100 Pa·s, as great as at least 150 Pa·s, at least 175 Pa·s, at least 200 Pa·s, or within any range defined between any two of the foregoing values, such as between at least 50 Pa·s and at least 200 Pa·s, at least 75 Pa·s and at least 175 Pa·s, or at least 100 Pa·s and 150 Pa·s. In one exemplary embodiment, the viscosity of the first component is at least 100 Pa·s.

a. Primary Silicone Oil

The thermal gel includes a primary silicone oil. In an exemplary embodiment, the primary silicone oil may include one or more polysiloxanes. The polysiloxane functions to wet the thermally conductive filler and to form a dispensable fluid for the thermal gel. The polysiloxane includes one or more crosslinkable groups, such as vinyl, hydride, hydroxyl and acrylate functional groups, that are crosslinked by the catalyst. In one embodiment, the one or more polysiloxanes include a vinyl silicone oil.

Exemplary silicone oils may include a vinyl silicone oil having a general formula as shown below:

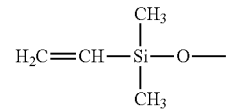

The mole ratio of vinyl groups in silicone oil is tested by iodometric titration. Iodometric titration includes: weighing 1-2 grams silicone oil in a tinfoil surrounded conical flask. Excess iodine bromide (IBr) solution (in n-pentane with available ratio) is added into the flask, and the flask is further sealed to avoid light exposure. Then, after an hour, the seal is opened, and 50 mL of 1 wt % potassium iodide (KI) aqueous solution is added. The solution is then vibrated for 1-2 minutes. A standard 0.1 mol/L sodium thiosulfate ($Na_2S_2O_3$) aqueous solution is added to titrate the sample solution with vibration. 1 mL of a 1 wt. % starch aqueous solution is added to the solution as an indicator. When the color of the solution (e.g., blue) changes, the titration is stopped and the consumption of sodium thiosulfate is calculated. This process is then repeated for other samples. To prepare a control ample, the process is repeated with no silicone oil. The mole ratio of vinyl groups (mmol/g) is as following:

$$N1 = \frac{(Vb - Va) * M1}{G1}$$

wherein N1 is the mole ratio of vinyl groups (mmol/g); Va is the volume (ml) of sodium thiosulfate solution titration for vinyl silicone oil sample; Vb is the volume (ml) of sodium thiosulfate solution titration for blank sample; G1 is the weight (g) of vinyl silicone oil; M1 is the mole concentration (mol/l) of the standard sodium thiosulfate solution.

The mole ratio of vinyl groups (mmol/g) in silicone oil may be in an amount as little as 0.0001, 0.001, 0.01, 0.1, as great as 0.5, 1, 5, 10 or within any range defined between any two of the foregoing values, such as 0.01 to 1, 0.1 to 0.5, or 0.0001 to 10. In one exemplary embodiment, the mole ratio of vinyl groups is in the amount between 0.1 to 0.3.

Vinyl functional silicone oils include an organo-silicone component with Si—CH═CH2 groups. Exemplary vinyl functional silicone oils include vinyl-terminated silicone oils and vinyl-grafted silicone oils in which the Si—CH═CH2 group is grafted onto the polymer chain, and combinations thereof.

Exemplary vinyl-terminated silicone oils include vinyl terminated polydimethylsiloxane, such as DMS-V05, DMS-V21, DMS-V22, DMS-V25, DMS-V25R, DMS-V35, DMS-V35R, DMS-V51, and DMS-V52, each available from Gelest, Inc.

Exemplary vinyl-grafted silicone oils include vinylmethylsiloxane-dimethylsiloxane copolymers, such as trimethylsiloxyl terminated silicone oils, silanol terminated silicone oils, and vinyl terminated silicone oils. Exemplary trimethylsiloxyl terminated silicone oils include VDT-127, VDT-431, and VDT-731; exemplary silanol terminated silicone oils include VDS-1013; and exemplary vinyl terminated silicone oils include VDV-0131; each available from Gelest, Inc.

In one exemplary embodiment, the vinyl-grafted silicone oil is a vinylmethylsiloxane terpolymers, including a vinylmethylsiloxane-octylmethylsiloxane-dimethylsiloxane terpolymer such as VAT-4326, or a vinylmethylsiloxane-phenylmethylsiloxane-dimethylsiloxane terpolymer such as VPT-1323. In some exemplary embodiment, the vinyl-grafted silicone oil is a vinylmethoxysiloxane homopolymer such as VMM-010, or a vinylethoxysiloxane-propylethoxysiloxane copolymer such as VPE-005. VAT-4326, VPT-1323, VMM-010, and VPE-005 are each available from Gelest, Inc., In one exemplary embodiment, the vinyl-functional silicone oil comprises a vinyl T resin or a vinyl Q resin. A vinyl T resin is a vinyl silsesquioxane having three (tri-substituted) oxygen substituting all or some of the silicon atoms in the polymer. Exemplary T resins include poly(phenyl-vinyl-silsesquixane) such as SST-3PV1, available from Gelest, Inc. A vinyl Q resin has four (tetra-substituted) oxygen substituting all or some of the silicon atoms in the polymer. Exemplary Q resins include VQM-135, VQM-146, available from Gelest, Inc. One type of vinyl Q resin is an activated cure specialty silicone rubber having the following base polymer structure:

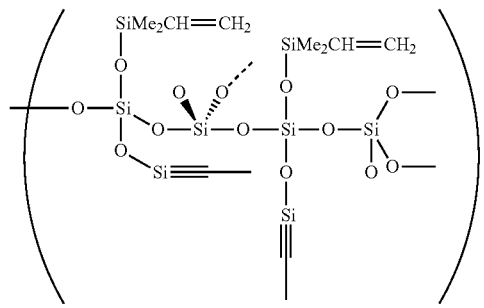

Exemplary Q resins include VQM-135, VQM-146, available from Gelest, Inc. In one exemplary embodiment, the polysiloxane is vinyl functional oil, such as RH-Vi303, RH-Vi301 from RUNHE, such as Andril® VS 200, Andril® VS 1000 from AB Specialty Silicones.

Exemplary primary silicone oils may have a kinematic viscosity as little as 5 cSt, 100 cSt, 500 cSt, as great as 5,000 cSt, 10,000 cSt, 50,000 cSt, or within any range defined between any two of the foregoing values as measured according to ASTM D445. In an exemplary embodiment, the vinyl silicone oil has a kinematic viscosity in the range of 1000 cSt to 5000 cSt. A thermal gel having a kinematic viscosity that is too low can result in evaporation of the components of the thermal gel or oil bleeding of the thermal gel when applied on a device The primary silicone oil gel may be in an amount as little as 1 wt. %, 2 wt. %, 4 wt. %, as great as 6 wt. %, 8 wt. %, 10 wt. %, or within any range defined between any two of the foregoing values, based on the total weight of the thermal gel, such as 1 wt. % to 10 wt. %, 1 wt. % to 5 wt. %, or 4 wt. % to 5 wt. %. In one exemplary embodiment, the first component of the thermal gel includes a primary silicone oil in the amount of 4.854 wt. %.

Exemplary silicone oils may have a weight ($M_w$) average molecular weight as little as 50 Daltons, 100 Daltons, 1000 Daltons, 10,000 Daltons, 50,000 Daltons, 70,000 Daltons, 100,000 Daltons, as great as 1,000,000 Daltons, 10,000,000 Daltons, 100,000,000 Daltons, or within any range defined between any two of the foregoing values, such as between 50 Daltons and 100,000,000 Daltons, 1000 Daltons to 10,000,000 Daltons, or 50,000 Daltons to 1,000,000 Daltons.

The vinyl group content (mmol) of the primary silicone oil in the first component is calculated by dividing the mole ratio of vinyl groups (mmol/g) by the weight of the primary silicone oil weight (g) of the first component.

b. Catalyst

The thermal gel further includes one or more catalysts for catalyzing the addition reaction. Exemplary catalysts comprise platinum containing materials. The presence of the catalyst enables a higher rate of crosslinking at room temperature. For the purposes of the present disclosure, room temperature is defined as between 15° C. and 25° C. Exemplary platinum containing catalysts may have the general formula shown below:

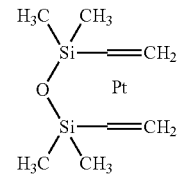

Exemplary platinum contain catalysts include: such as Platinum cyclovinylmethylsiloxane complex (Ashby Karstedt Catalyst), Platinum carbonyl cyclovinylmethylsiloxane complex (Ossko catalyst), Platinum divinyltetramethyldisiloxane dimethyl fumarate complex, Platinum divinyltetramethyldisiloxane dimethyl maleate complex and the like. Exemplary of Platinum carbonyl cyclovinylmethylsiloxane complexes include SIP6829.2, exemplary of Platinum divinyltetramethyldisiloxane complex include SIP6830.3 and SIP6831.2, exemplary of platinum cyclovinylmethylsiloxane complex include SIP6833.2, all available from Gelest, Inc.

Without wishing to be held to any particular theory it is believed that the platinum catalyst reacts with a vinyl silicone oil and a hydrosilicone oil as shown below.

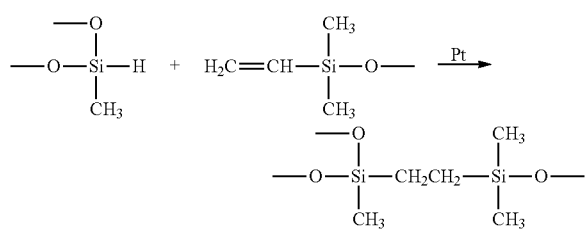

The thermal gel may comprise the one or more catalyst in an amount as little as 5 ppm, 10 ppm, 15 ppm, 20 ppm, 25 ppm, 30 ppm, 40 ppm, 50 ppm, 100 ppm, as great as 200 ppm, 500 ppm, 1000 ppm, 5000 ppm, 10000 ppm, 100000 ppm, or within any range defined between any two of the foregoing values, based on the total weight of the silicone oil, such as 10 ppm to 200 ppm, 20 ppm to 1000 ppm, or 5 ppm to 10000 ppm. In an exemplary embodiment, the catalyst is Pt based catalyst with at least 2000 ppm weight loading in the first component. The presence of the catalyst enables a higher rate of crosslinking at room temperature.

In one exemplary embodiment, the catalyst is provided as a mixture with one or more of the silicone oils. In one exemplary embodiment, the catalyst is combined to a vinyl functional silicone oil, such as KE-1012-A, KE-1031-A, KE-109E-A, KE-1051J-A, KE-1800T-A, KE1204A, KE1218A available from Shin-Etsu, such as SILBIONE® RT Gel 4725 SLD A available from Bluestar, such as SilGel® 612 A, ELASTOSIL® LR 3153A, ELASTOSIL® LR 3003A, ELASTOSIL® LR 3005A, SEMICOSIL® 961A, SEMICOSIL® 927A, SEMICOSIL® 205A, SEMICOSIL® 9212A, SILPURAN® 2440 available from Wacker, such as Silopren® LSR 2010A available from Momentive, such as XIAMETER® RBL-9200 A, XIAMETER® RBL-2004 A, XIAMETER® RBL-9050 A, XIAMETER® RBL-1552 A, Silastic® FL 30-9201 A, Silastic® 9202 A, Silastic® 9204 A, Silastic® 9206 A, SYLGARD® 184A, Dow Corning® QP-1 A, Dow Corning® C6 A, Dow Corning® CV9204 A available from Dow Corning. In one exemplary embodiment, the catalyst is combined to vinyl and hydride functional silicone oils, such as KE-1056, KE-1151, KE-1820, KE-1825, KE-1830, KE-1831, KE-1833, KE-1842, KE-1884, KE-1885, KE-1886, FE-57, FE-61 available from Shin-Etsu, such as Syl-Off® 7395, Syl-Off® 7610, Syl-Off® 7817, Syl-Off® 7612, Syl-Off® 7780 available from Dow Corning.

The thermal gel may comprise a catalyst in an amount as little as 0.001 wt %, 0.005 wt. %, 0.01 wt. %, as great as 0.015 wt. %, 0.020 wt. %, 0.025 wt. %, or within any range defined between any two of the foregoing values, based on the total weight of the thermal gel. In one exemplary embodiment, the thermal gel includes a catalyst in the amount of 0.019 wt. %.

c. Inhibitor

The thermal gel comprises one or more addition inhibitors for inhibiting or limiting the reaction of the primary silicone oil and the cross linking silicone oil (discussed herein) of the second component of the second component. Without wishing to be held to any particular theory, it is believed that, in the absence of an addition inhibitor, the primary silicone oil reacts with the cross linking functional silicone oil very quickly based on the addition hydrosilylation mechanism to form a solid phase that cannot be automatically dispensed by typical methods. The addition inhibitors includes at least one alkynyl compound, and optionally, the addition inhibitor further includes a multi-vinyl functional polysiloxane.

Exemplary addition inhibitors include acetylenic alcohols such as 1-ethynyl-1-cyclohexanol, 2-methyl-3-butyn-2-ol, 2-phenyl-3-butyn-2-ol, 2-ethynyl-isopropanol, 2-ethynyl-butane-2-ol, and 3,5-dimethyl-1-hexyn-3-ol; silylated acetylenic alcohols such as trimethyl (3,5-dimethyl-1-hexyn-3-oxy)silane, dimethyl-bis-(3-methyl-1-butyn-oxy)silane, methylvinylbis(3-methyl-1-butyn-3-oxy)silane, and ((1,1-dimethyl-2-propynyl)oxy)trimethylsilane; unsaturated carboxylic esters such as diallyl maleate, dimethyl maleate, diethyl fumarate, diallyl fumarate, and bis-2-methoxy-1-methylethylmaleate, mono-octylmaleate, mono-isooctylmaleate, mono-allyl maleate, mono-methyl maleate, mono-ethyl fumarate, mono-allyl fumarate, 2-methoxy-1-methylethylmaleate; fumarate/alcohol mixtures, such as mixtures where the alcohol is selected from benzyl alcohol or 1-octanol and ethenyl cyclohexyl-1-ol; conjugated eneynes such as 2-isobutyl-1-butene-3-yne, 3,5-dimethyl-3-hexene-1-yne, 3-methyl-3-pentene-1-yne, 3-methyl-3-hexene-1-yne, 1-ethynylcyclohexene, 3-ethyl-3-butene-1-yne, and 3-phenyl-3-butene-1-yne; vinylcyclosiloxanes such as 1,3,5,7-tetramethyl-1,3,5,7-tetravinylcyclotetrasiloxane, and mixtures of conjugated ene-yne and vinylcyclosiloxane. In one exemplary embodiment, the addition inhibitor is selected from 2-methyl-3-butyn-2-ol or 3-methyl-1-pentyn-3-ol.

In some exemplary embodiments, the addition inhibitor further includes a multi-vinyl functional polysiloxane. An exemplary multi-vinyl functional polysiloxane is a vinyl terminated polydimethylsiloxane in ethynyl cyclohexanol, such as Pt Inhibitor 88 available from Wacker Chemie AG. Without wishing to be held to any particular theory it is believed that the platinum catalyst forms a complex with ethynyl cyclohexanol and vinyl terminated polydimethylsiloxane as shown below.

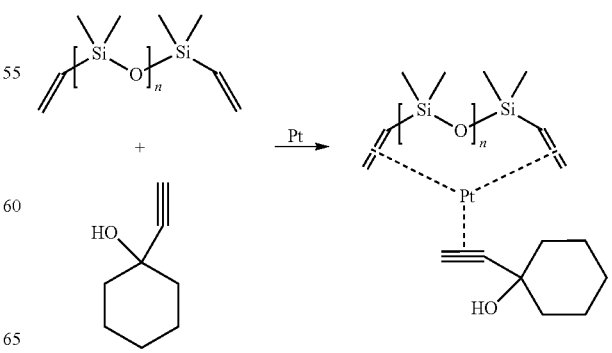

The formation of the complex is believed to decrease the catalyst activity in room temperature, and thus maintaining the dispensability and wettability of the TIM. At the higher temperatures of the curing step, the Pt is released from the complex and help the hydrosilylation of vinyl functional silicone oil and hydride functional silicone oil, provides greater control over the "crosslinking".

In some exemplary embodiments, the thermal gel may comprise the one or more addition inhibitors in an amount as little as 0.001 wt. %, 0.002 wt. %, 0.005 wt. %, 0.01 wt. %, 0.015 wt. %, as great as 0.02 wt. %, 0.025 wt. %, 0.03 wt. %, 0.05 wt. %, 0.1 wt. %, or within any range defined between any two of the foregoing values, based on the total weight of the thermal gel, such as 0.001 wt. % to 0.1 wt. %, 0.001 wt. % to 0.05 wt. %, or 0.005 wt. % to 0.02 wt. %. In one exemplary embodiment, the thermal gel includes an addition inhibitor in the amount of 0.005 wt. %.

In one exemplary embodiment, the addition inhibitor is combined to functional silicone oils, such as KE-1056, KE-1151, KE-1820, KE-1825, KE-1830, KE-1831, KE-1833, KE-1842, KE-1884, KE-1885, KE-1886, FE-57, FE-61 available from Shin-Etsu, such as Syl-Off® 7395, Syl-Off® 7610, Syl-Off® 7817, Syl-Off® 7612, Syl-Off® 7780 available from Dow Corning.

2. Second Component a. Primary Silicone Oil

The second component of the thermal gel includes a primary silicone oil in accordance with the description above. It is within the scope of the present disclosure that the primary silicone oil of the first component and the primary silicone oil of the second component are different silicone oil compounds. It is also within the scope of the present disclosure that the primary silicone oil of the first component and the primary silicone oil of the second component are the same silicone oil compounds.

The vinyl group content (mmol) of the primary silicone oil in the second component is calculated by dividing the mole ratio of vinyl groups (mmol/g) by the weight of the primary silicone oil weight (g) of the second component.

The total content of vinyl groups ($T_{vinyl}$, mmol) in total formulation is calculated by summing the content of vinyl groups in primary silicone oil of first component and the content of vinyl groups in primary silicone oil of second component.

b. Cross-Linking Silicone Oil

The thermal gel may further include a cross linking silicone oil. The cross linking silicone oil may include Si—H groups. Exemplary silicone oils include a hydrosilicone oil having a general formula as shown below. Exemplary hydrosilicone oils function as a cross linker in the addition reaction with the primary silicone oils.

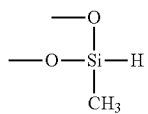

The mole ratio of Si—H groups in cross linking silicone oil is tested by iodometric titration. Iodometric titration includes: weighing about 0.1 grams of hydride silicone oil in a tinfoil surrounded conical flask. 20 mL carbon tetrachloride ($CCl_4$) is added into the flask to dissolve the silicone oil. and the flask is further sealed to avoid light exposure. Then, excess bromine acetic acid solution (with an availability ratio of about 10 mL) is added into the flask along with 10 mL of water. The flask is further sealed to avoid light exposure. After thirty minutes, the seal is opened and 25 ml 10% wt potassium iodide (KI) aqueous solution is added to the solution. The solution is then vibrated for 1 to 2 minutes. Then, a standard 0.1 mol/L sodium thiosulfate ($Na_2S_2O_3$) aqueous solution is added to titrate the sample solution with vibration. 1 mL of a 1 wt. % starch aqueous solution is added to the solution as an indicator. When the color of the solution (e.g., blue) changes, titration is stopped and the consumption of sodium thiosulfate is calculated. This process is then repeated for other samples. To prepare a control sample, the process is repeated with no silicone oil. The content of Si—H groups (mmol/g) is as following $$N2 = \frac{(Vd - Vc) * M2}{G2}$$

wherein: N2 is the mole ratio of Si—H groups (mmol/g); Vd is the volume (ml) of sodium thiosulfate solution titration for hydride silicone oil sample; Vc is the volume (ml) of sodium thiosulfate solution titration for blank sample; G2 is the weight (g) of hydride silicone oil; M2 is the mole concentration (mol/l) of the standard sodium thiosulfate solution.

The mole ratio of Si—H groups (mmol/g) in silicone oil may be in an amount as little as 0.0001, 0.001, 0.01, 0.1, as great as 1, 5, 10, 50 or within any range defined between any two of the foregoing values, such as 0.01 to 1, 0.1 to 5, or 0.0001 to 50. In one exemplary embodiment, the mole ratio of Si—H groups is in the amount of 0.2 to 2.

In one exemplary embodiment, the cross linking silicone oil comprises a hydride functional silicone oil having an organo-silicone component and Si—H groups. Exemplary hydride functional silicone oils include hydride-terminated silicone oils and hydride-grafted silicone oils in which the Si—H group is grafted onto the polymer chain, and combinations thereof.

In one exemplary embodiment, the hydride-terminated silicone oil is a hydride terminated polydimethylsiloxane such as DMS-H05, DMS-H21, DMS-H25, DMS-H31, or DMS-H41, each available from Gelest, Inc. In one exemplary embodiment, the hydride-terminated silicone oil is a methylhydrosiloxane-dimethylsiloxane copolymer, such as a trimethylsiloxyl terminated or hydride terminated. Exemplary trimethylsiloxyl terminated copolymers include HMS-013, HMS-031, HMS-064, HMS-071, HMS-082, HMS-151, HMS-301, HMS-501; exemplary hydride terminated copolymers include HMS-H271; each of which is available from Gelest, Inc. In one exemplary embodiment, the hydride-grafted silicone oil is polymethylhydrosiloxane with trimethylsiloxyl terminated, such as HMS-991, HMS-992, HMS-993, each available from Gelest, Inc.

In one exemplary embodiment, the hydride-grafted silicone oil is polyethylhydrosiloxane with triethylsiloxyl terminated, such as HES-992, available from Gelest, Inc. In one exemplary embodiment, the hydride-grafted silicone oil is methylhydrosiloxane-octylmethylsiloxane copolymer, such as HAM-301 available from Gelest, Inc.

In one exemplary embodiment, the hydride functional oil is a Q resin or T resin, Exemplary T resins include SST-3MH1.1, exemplary Q resins include HQM-105 and HQM-107, each available from Gelest, Inc.

In one exemplary embodiment, the polysiloxane is a hydride functional oil, such as Andri® XL-10, Andri® XL-12 available from AB Specialty Silicones, such as RH-DH04, and RH-H503 available from RUNHE, such as KE-1012-B, KE-1031-B, KE-109E-B, KE-1051J-B, KE-1800T-B, KE1204B, KE1218B available from Shin-Etsu, such as SILBIONE® RT Gel 4725 SLD B available from Bluestar, such as SilGel® 612 B, ELASTOSIL® LR 3153B, ELASTOSIL® LR 3003B, ELASTOSIL® LR 3005B, SEMICOSIL® 961B, SEMICOSIL® 927B, SEMICOSIL® 205B, SEMICOSIL® 9212B, SILPURAN® 2440 available from Wacker, such as Silopren® LSR 2010B available from Momentive, such as XIAMETER® RBL-9200 B, XIAMETER® RBL-2004 B, XIAMETER® RBL-9050 B, XIAMETER® RBL-1552 B, Silastic® FL 30-9201 B, Silastic® 9202 B, Silastic® 9204 B, Silastic® 9206 B, SYLGARD® 184B, Dow Corning® QP-1 B, Dow Corning® C6 B, Dow Corning® CV9204 B available from Dow Corning.

In one exemplary embodiment, the polysiloxane includes a silicone rubber such as the KE series products available from Shin-Etsu, such as SILBIONE® available from Bluestar, such as ELASTOSIL®, SilGel®, SILPURAN®, and SEMICOSIL® available from Wacker, such as Silopren® available from Momentive, such as Dow Corning®, Silastic®, XIAMETER®, Syl-Off® and SYLGARD® available from Dow Corning, such as Andril® available from AB specialty Silicones. Other polysiloxanes are available from Wacker, Shin-etsu, Dowcoring, Momentive, Bluestar, RUNHE, AB Specialty Silicones and Gelest.

Exemplary cross linking silicone oils may have a kinematic viscosity as little as 0.5 cSt, 5 cSt, 100 cSt, 200 cSt, as great as 1,000 cSt, 10,000 cSt, 100,000 cSt, or within any range defined between any two of the foregoing values as measured according to ASTM D445, such as between 0.5 cSt and 100,000 cSt, 5 cSt and 10,000 cSt, 100 cSt and 1,000 cSt, or 200 cSt and 1,000 cSt. In one exemplary embodiment, the cross linking silicone oil has a kinematic viscosity between 300 cSt and 700 cSt.

The cross linking silicone oil may be present in an amount as little as 0.1 wt. %, 0.2 wt. %, 0.4 wt. %, as great as 0.6 wt. %, 0.8 wt. %, 1.0 wt. %, or within any range defined between any two of the foregoing values, based on the total weight of the thermal gel, such as 0.1 wt. % to 1.0 wt. %, 0.1 wt. % to 0.5 wt. %, or 0.1 wt. % to 0.4 wt. %.

In an exemplary embodiment, the second component of the thermal gel includes a primary silicone oil in the first component in the amount of 4.746 wt. % and a cross linking silicone oil in the amount of 0.26 wt. %.

Exemplary silicone oils may have a weight ($M_w$) average molecular weight as little as 50 Daltons, 100 Daltons, 1000 Daltons, 10,000 Daltons, 50,000 Daltons, 70,000 Daltons, 100,000 Daltons, as great as 1,000,000 Daltons, 10,000,000 Daltons, 100,000,000 Daltons, or within any range defined between any two of the foregoing values, such as between 50 Daltons and 100,000,000 Daltons, 1000 Daltons to 10,000,000 Daltons, or 50,000 Daltons to 1,000,000 Daltons.

The total content of Si—H groups ($T_{Si-H}$, mmol) in total formulation is calculated by dividing the mole ratio of Si—H groups (mmol/g) of cross linking silicone oil in second component by the weight (g) of crosslinking silicone oil in second component.

The ratio of total content of Si—H groups ($T_{Si-H}$) to total content of vinyl groups ($T_{vinyl}$), calculated by $T_{Si-H}/T_{vinyl}$, may be in an amount as little as 0.0001, 0.001, 0.01, as great as 0.1, 1, 10, 100,1000 or within any range defined between any two of the foregoing values, such as between 0.001 to 0.1, 0.01 to 1, or 0.001 to 100. In an exemplary formulation, the ratio of total content of Si—H groups ($T_{Si-H}$) to total content of vinyl groups ($T_{vinyl}$) may be between 0.03 to 10.

3. Thermally Conductive Filler

The first and second components of the thermal gel include one or more thermally conductive fillers. However, it is within the scope of the present disclosure that only one of the first and second components of the thermal gel include one or more thermally conductive fillers. Further, it is within the scope of the present disclosure that neither the first nor the second component of the thermal gel include one or more thermally conductive fillers.

In an exemplary embodiment, the first and second components each include a bimodal aluminum filler in which a primary filler and a secondary filler are provided. The primary filler operates as a bulk filler and functions to provide a matrix for the component of the component while the secondary filler has a filling/uniformity function in which gaps within the matrix formed by the primary filler are filled.

Exemplary thermally conductive fillers include metals, alloys, nonmetals, metal oxides and ceramics, and combinations thereof. The metals include, but are not limited to, aluminum, copper, silver, zinc, nickel, tin, indium, and lead. The nonmetal include, but are not limited to, carbon, graphite, carbon nanotubes, carbon fibers, graphenes, boron nitride and silicon nitride. The metal oxide or ceramics include but not limited to alumina (aluminum oxide), aluminum nitride, boron nitride, zinc oxide, and tin oxide.

The thermal gel may comprise a total amount of combined thermally conductive fillers in an amount as little as 75 wt. %, 77 wt. %, 80 wt. %, as great as 90 wt. %, 92 wt. %, 95 wt. %, or within any range defined between any two of the foregoing values, based on the total weight of the thermal gel, such as 75 wt. % to 95 wt. %, or 77 wt. % to 92 wt. %, 80 wt. % to 90 wt. %.

Exemplary thermally conductive fillers may have an average particle size ($D_{50}$: mass-median-diameter (MMD) or average particle diameter by mass or the log-normal distribution mass median diameter) as measured through a laser diffraction analyzer in accordance with ASTM B822 of as little as 5 microns, 10 micron, 20 microns, as great as 40 microns, 60 microns, 80 microns or within any range defined between any two of the foregoing values.

In one exemplary embodiment, the first component and/or the second component of the thermal gel may include a first thermally conductive filler and a second thermally conductive filler, wherein the first thermally conductive filer is a plurality of metal particles having have a particle size of 70 microns and the second thermally conductive filler is a plurality of metal particles having a particle size of 5 microns. In a more particular embodiment, a ratio of the first thermally conductive filler to the second thermally conductive filler may be as little as 1:5, 1:4, 1:3, 1:2, as great as 1:1, 1.5:1, 2:1, 3:1, 4:1, 5:1, or within any range defined between any two of the foregoing values, such as 1:5 to 5:1, 1:1 to 3:1, or 1.5:1 to 3:1.

4. Additives (Coloring Agent)

The thermal gel includes a coloring agent to differentiate between the two components, such as organic and inorganic pigments and organic dyes. It is within the scope of the present disclosure that only one of the first component and the second component of the thermal gel include a coloring agent or other additives. It is also within the scope of the present disclosure that both the first component and the second component of the thermal gel include a coloring agent or other additives. Further, it is within the scope of the present disclosure that neither the first nor the second component of the thermal gel include a coloring agent or other additives.

Exemplary organic pigments include: benzimidazolone, such as the blue shade benzimidazolone pigment Novoperm Carmine HF3C from Clariant International Ltd, Muttenz Switzerland. Exemplary inorganic pigments include carbon black and iron based compounds. Exemplary iron based compounds include iron oxide compounds such as $\alpha$-$Fe_2O_3$, $\alpha$-$Fe_2O_3 \cdot H_2O$, $Fe_3O_4$ and combinations thereof. Exemplary organic dyes include: Benzo[kl]thioxanthene-3,4-dicarboximide,N-octadecyl-(8Cl); Benzothioxanthene-3,4-dicarboxylic acid-N-stearylimide.

In some exemplary embodiments, the coloring agent is an inorganic pigment selected from the group consisting of $\alpha$-$Fe_2O_3$; $\alpha$-$Fe_2O_3 \cdot H_2O$; and $Fe_3O_4$.

In some exemplary embodiments, the coloring agent is an organic pigment. In a more particular embodiment, the coloring agent is an organic selected from the group consisting of Formulas (I)-(XVI).

In a more particular embodiment, the coloring agent is an organic pigment of Formula (I), also known as pigment red 176, and having CAS No. 12225-06-8.

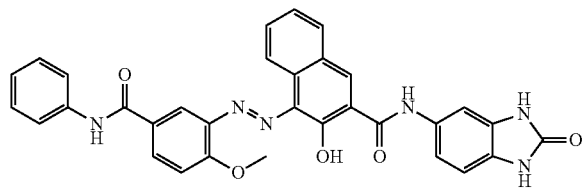

Formula (I)

In a more particular embodiment, the coloring agent is an organic pigment of Formula (II), also known as calcium bis[4-[[1-[[(2-methylphenyl)amino]carbonyl]-2-oxopropyl]azo]-3-nitrobenzenesulphonate, and having CAS No. 12286-66-7.

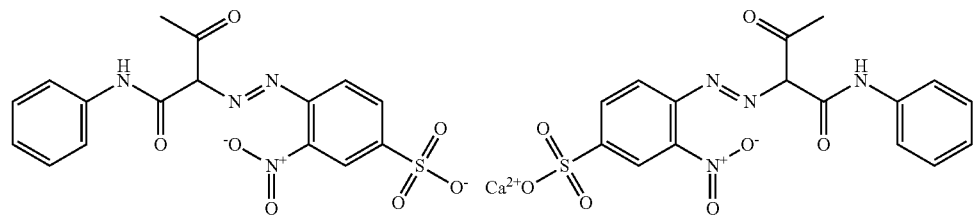

Formula (II)

In a more particular embodiment, the coloring agent is an organic pigment of Formula (III) also known as diethyl 4,4'-[(3,3'-dichloro[1,1'-biphenyl]-4,4'-diyl)bis(azo)]bis[4,5-dihydro-5-oxo-1-phenyl-1h-pyrazole-3-carboxylate], and having CAS No. 6358-87-8.

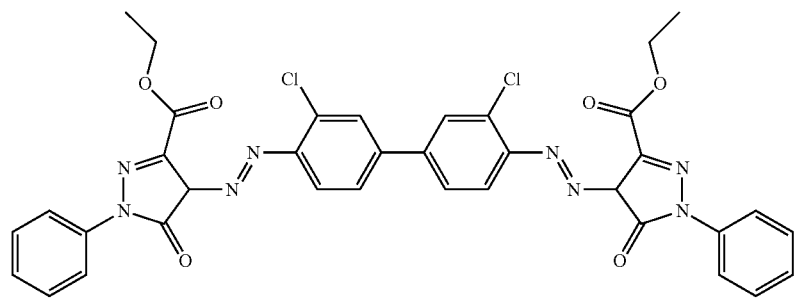

Formula (III)

In a more particular embodiment, the coloring agent is an organic pigment of Formula (IV) also known as 2,2'-[(3,3'-Dichloro[1,1'-biphenyl]-4,4'-diyl)bis(azo)]bis[N-(2,4-dimethylphenyl)-3-oxo-butanamide, and having CAS No. 5102-83-0.

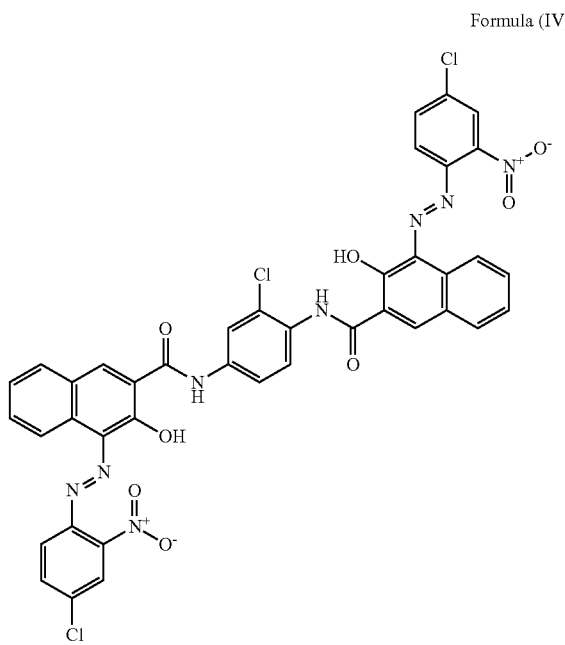 [SMILES: O=C(Nc1ccc(NC(=O)c2cc3ccccc3c(/N=N/c3ccc(Cl)cc3[N+](=O)[O-])c2O)c(Cl)c1)c1cc2ccccc2c(/N=N/c2ccc(Cl)cc2[N+](=O)[O-])c1O]

Formula (IV)

In a more particular embodiment, the coloring agent is an organic pigment of Formula (V) also known as (29H,31H-phthalocyaninato(2-)-N29,N30,N31,N32)copper, and having CAS No. 147-14-8.

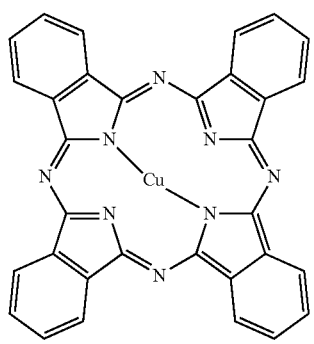

Formula (V)

In a more particular embodiment, the coloring agent is an organic pigment of Formula (VI) also known as brilliant-greenphthalocyanine, and having CAS No. 1328-53-6.

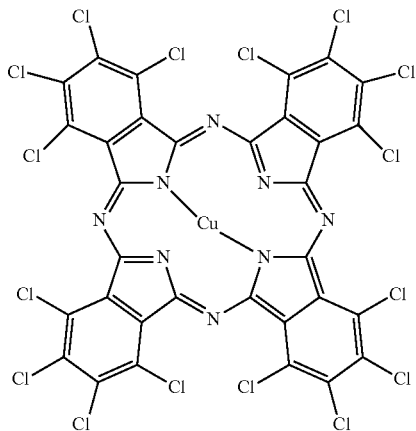

Formula (VI)

In a more particular embodiment, the coloring agent is an organic pigment of Formula (VII) also known as 9,19-dichloro-5,15-diethyl-5,15-dihydro-diindolo[2,3-c:2',3'-n]triphenodioxazine, and having CAS No. 6358-30-1.

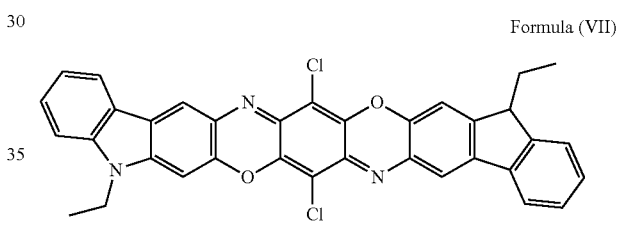

Formula (VII)

In a more particular embodiment, the coloring agent is an organic pigment of Formula (VIII) also known as 5,12-DIHYDROQUIN[2,3-B]ACRIDINE-7,14-DIONE; 5,12-dihydroquino[2,3-b]acridine-7,14-dione, and having CAS No. 1047-16-1.

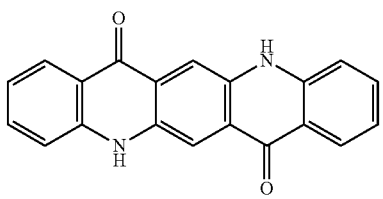

Formula (VIII)

In a more particular embodiment, the coloring agent is an organic pigment of Formula (IX) also known as 2,9-bis(3,5-dimethylphenyl)anthra[2,1,9-def:6,5,10-d'e'f']diisoquinoline-1,3,8,10(2h,9h)-tetrone, and having CAS No. 4948-15-6.

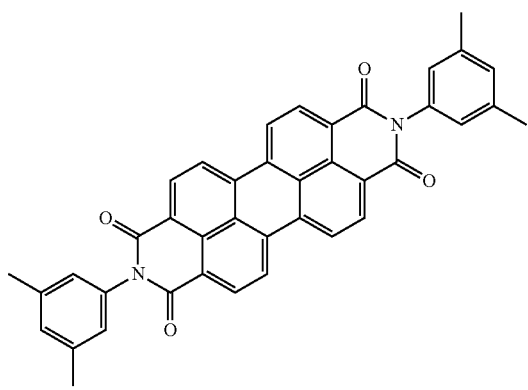

Formula (IX)

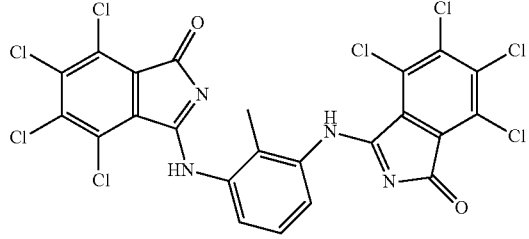

Formula (XI)

In a more particular embodiment, the coloring agent is an organic pigment of Formula (XII) also known as calcium bis[4-[[1-[[(2-chlorophenyl)amino]carbonyl]-2-oxopropyl]azo]-3-nitrobenzenesulphonate], and having CAS No. 71832-85-4.

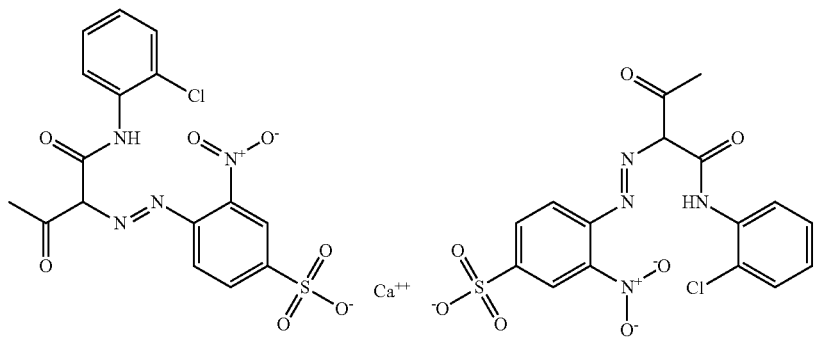

Formula (XII)

In a more particular embodiment, the coloring agent is an organic pigment of Formula (X) also known as 4,4'-diamino-[1,1'-bianthracene]-9,9',10,10'-tetraone or pigment red 177, and having CAS No. 4051-63-2.

In a more particular embodiment, the coloring agent is an organic pigment of Formula (XIII) also known as 3,4,5,6-Tetrachloro-N-[2-(4,5,6,7-tetrachloro-2,3-dihydro-1,3-dioxo-1H-inden-2-yl)-8-quinolyl]phthalimide, and having CAS No. 30125-47-4.

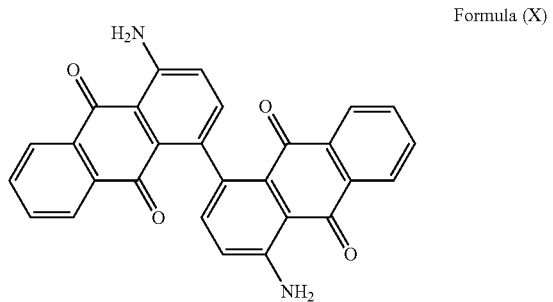 [SMILES: Nc1ccc(-c2ccc(N)c3c2C(=O)c2ccccc2C3=O)c2c1C(=O)c1ccccc1C2=O]

Formula (X)

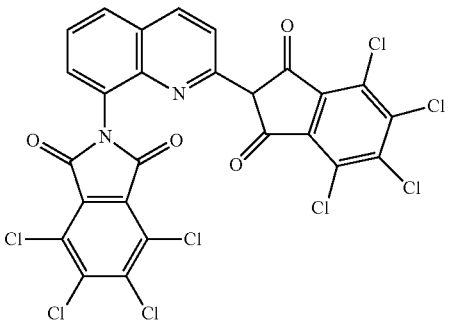

Formula (XIII)

In a more particular embodiment, the coloring agent is an organic pigment of Formula (XI) also known as 3,3'-[(2-methyl-1,3-phenylene)diimino]bis[4,5,6,7-tetrachloro-1H-isoindol-1-one], and having CAS No. 5045-40-9.

In a more particular embodiment, the coloring agent is an organic pigment of Formula (XIV) also known as [1,3-dihydro-5,6-bis[[(2-hydroxy-1-naphthyl)methylene]amino]-2H-benzimidazol-2-onato(2-)-N5,N6,O5,O6]nickel, and having CAS No. 42844-93-9.

Formula (XIV)

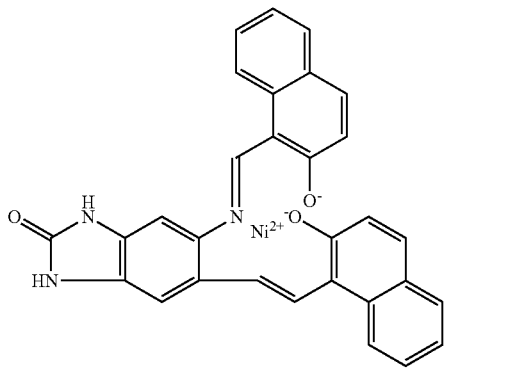

In a more particular embodiment, the coloring agent is an organic pigment of Formula (XV) also known as Pigment Red 279, and having CAS No. 832743-59-6, wherein each R is independently selected from the group consisting of hydrogen, alkyl, aryl, and halogen. In an even more particular embodiment, each R is independently selected from the group consisting of hydrogen, $C_1$-$C_6$ alkyl, phenyl, and halogen. In another more particular embodiment, each R is chlorine, and even more particularly, each R is 7-chloro.

Formula (XV)

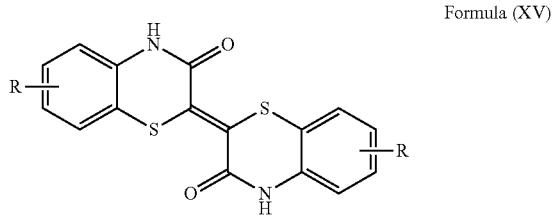

In a more particular embodiment, the coloring agent is an organic pigment of Formula (XVI) also known as Pyrimido[5,4-g]pteridine-2,4,6,8-tetramine, 4-methylbenzenesulfonate, base-hydrolysed, and having CAS No. 346709-25-9.

Formula (XVI)

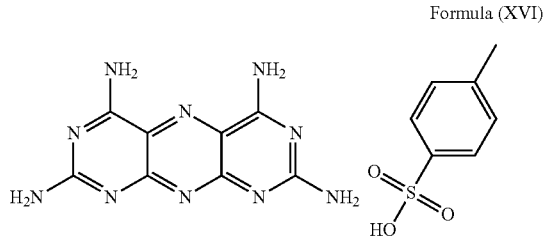

In one more particular embodiment, the coloring agent is α-$Fe_2O_3$, such as such as Iron Red available from BAI YAN. In another more particular embodiment, the coloring agent is α-$Fe_2O_3$.$H_2O$, such as such as Iron Yellow available from BAI YAN. In still another more particular embodiment, the coloring agent is $Fe_3O_4$, such as such as Iron Blue available from BAI YAN. In yet still another more particular embodiment, the coloring agent is the pigment of Formula (I), having the chemical formula $C_{32}H_{24}N_6O_5$, such as Novoperm Carmine HF3C, available from Clariant International Ltd, Muttenz Switzerland.

In some exemplary embodiments, the thermal gel comprises the coloring agent in an amount as little as 0.001 wt. %, 0.005 wt. %, 0.01 wt. %, as great as 0.015 wt. %, 0.02 wt. %, 0.025 wt. %, 0.03 wt. %, 0.05 wt. %, or within any range defined between any two of the foregoing values, such as 0.001 wt. % to 0.05 wt. %, or 0.005 wt. % to 0.02 wt. %, for example, based on 100 wt. % of the thermal gel without the coloring agent.

B. Method of Forming a Thermal Gel

Referring to FIG. 1, a method 100 of preparing a first component of a thermal gel is shown. At step 102, a reaction vessel is opened and a silicone oil, inhibitor, and a catalyst are weighed and added to the reaction vessel to form a mixture. The mixture is agitated for a period of time. Exemplary agitation rates may be as little as under 20 revolutions per minute (rpm), 25 rpm, 30 rpm, as great as 35 rpm, 37 rpm, 40 rpm or within any range defined between any two of the foregoing values. Exemplary time periods for agitation rates are as little as 1 minute, 3 minutes, 5 minutes, as great as 6 minutes, 8 minutes, 10 minutes, or within any range defined between two of the foregoing values. In an exemplary embodiment, the mixture is agitated at a rate of under 30 rpm for 5 minutes.

Method 100 then proceeds to step 104 where a first thermally conductive filler and pigment are added to the reaction vessel. The resulting mixture in the reaction vessel is then agitated for a period of time. Exemplary agitation rates may be as little as under 5 revolutions per minute (rpm), 7 rpm, 9 rpm, as great as 10 rpm, 12 rpm, 15 rpm or within any range defined between any two of the foregoing values. Exemplary time periods for agitation rates are as little as 1 minute, 3 minutes, 5 minutes, as great as 6 minutes, 8 minutes, 10 minutes, or within any range defined between two of the foregoing values. In an exemplary embodiment, the mixture is agitated at a rate of under 10 rpm for 5 minutes.

Method 100 then proceeds to step 106 where a second thermally conductive filler is added to the reaction vessel and the resulting mixture is agitated at a first rate for a first period time followed by agitation at a second rate for a second period of time. Exemplary agitation rates may be as little as under 5 revolutions per minute (rpm), 10 rpm, 20 rpm, 30 rpm, as great as 40 rpm, 50 rpm, 60 rpm, 70 rpm, or within any range defined between any two of the foregoing values. Exemplary time periods for agitation rates are as little as 5 minutes, 10 minutes, 20 minutes, 30 minutes, as great as 40 minutes, 50 minutes, 60 minutes, 70 minutes, or within any range defined between two of the foregoing values. In an exemplary embodiment, the mixture is agitated at 10 rpm for 10 minutes followed by agitation at 54 rpm for 1 hour.

Then, method 100 proceeds to step 108 where the mixture is under vacuum in the reaction vessel while agitation continues for a period of time. Exemplary agitation rates may be as little as under 40 revolutions per minute (rpm), 45 rpm, 50 rpm, as great as 55 rpm, 60 rpm, 65 rpm, 70 rpm, or within any range defined between any two of the foregoing values. Exemplary time periods for agitation rates are as little as 10 minutes, 15 minutes, 20 minutes, as great as 30 minutes, 40 minutes, 50 minutes, or within any range defined between two of the foregoing values. In an exemplary embodiment, the mixture is under vacuum and agitated at 54 rpm for 30 minutes.

Method 100 then proceeds to step 110 where the vacuum is stopped and the contents of the reaction vessel are transferred to a discharger where a vacuum is applied to remove the air in the resulting paste. The vacuum is then stopped and the resulting paste is compressed into a syringe.

Figure 2:
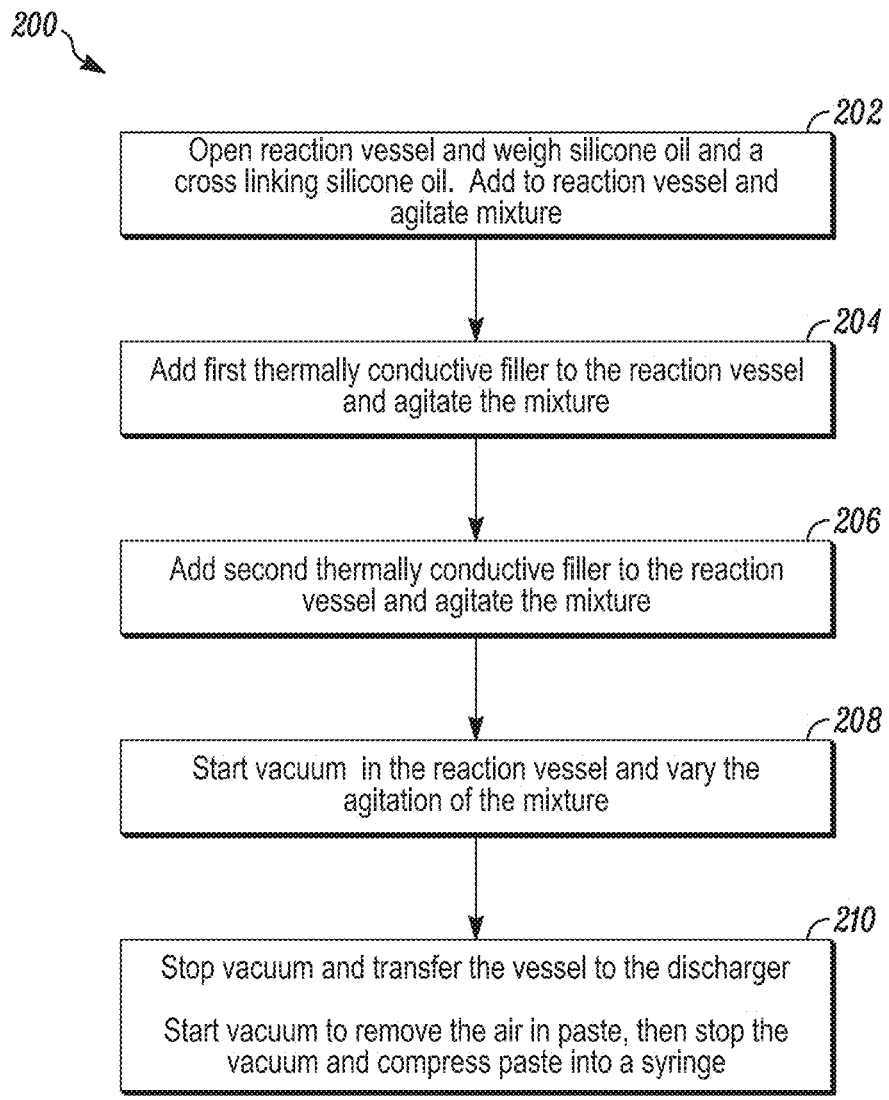
FIG. 2 is a flowchart relating to a method of preparing a second component of the thermal gel.

Referring to FIG. 2, a method 200 of preparing a second component of a thermal gel is shown. At step 202, a reaction vessel is opened and a silicone oil and a cross linking silicone oil are weighed and added to the reaction vessel to form a mixture. The mixture is agitated for a period of time. Exemplary agitation rates may be as little as under 20 revolutions per minute (rpm), 25 rpm, 30 rpm, as great as 35 rpm, 37 rpm, 40 rpm or within any range defined between any two of the foregoing values. Exemplary time periods for agitation rates are as little as 1 minute, 3 minutes, 5 minutes, as great as 6 minutes, 8 minutes, 10 minutes, or within any range defined between two of the foregoing values. In an exemplary embodiment, the mixture is agitated at a rate of under 30 rpm for 5 minutes.

Method 200 then proceeds to step 204 where a first thermally conductive filler is added to the reaction vessel. The resulting mixture in the reaction vessel is then agitated for a period of time. Exemplary agitation rates may be as little as under 5 revolutions per minute (rpm), 7 rpm, 9 rpm, as great as 10 rpm, 12 rpm, 15 rpm or within any range defined between any two of the foregoing values. Exemplary time periods for agitation rates are as little as 1 minute, 3 minutes, 5 minutes, as great as 6 minutes, 8 minutes, 10 minutes, or within any range defined between two of the foregoing values. In an exemplary embodiment, the mixture is agitated at a rate of under 10 rpm for 5 minutes.

Method 200 then proceeds to step 206 where a second thermally conductive filler is added to the reaction vessel and the resulting mixture is agitated at a first rate for a first period time followed by agitation at a second rate for a second period of time. Exemplary agitation rates may be as little as under 5 revolutions per minute (rpm), 10 rpm, 20 rpm, 30 rpm, as great as 40 rpm, 50 rpm, 60 rpm, 70 rpm, or within any range defined between any two of the foregoing values. Exemplary time periods for agitation rates are as little as 5 minutes, 10 minutes, 20 minutes, 30 minutes, as great as 40 minutes, 50 minutes, 60 minutes, 70 minutes, or within any range defined between two of the foregoing values. In an exemplary embodiment, the mixture is agitated at 10 rpm for 10 minutes followed by agitation at 54 rpm for 1 hour.

Then, method 200 proceeds to step 208 where the mixture is under vacuum in the reaction vessel while agitation continues for a period of time. Exemplary agitation rates may be as little as under 40 revolutions per minute (rpm), 45 rpm, 50 rpm, as great as 55 rpm, 60 rpm, 65 rpm, 70 rpm, or within any range defined between any two of the foregoing values. Exemplary time periods for agitation rates are as little as 10 minutes, 15 minutes, 20 minutes, as great as 30 minutes, 40 minutes, 50 minutes, or within any range defined between two of the foregoing values. In an exemplary embodiment, the mixture is under vacuum and agitated at 54 rpm for 30 minutes.

Method 200 then proceeds to step 210 where the vacuum is stopped and the contents of the reaction vessel are transferred to the discharger where a vacuum is applied to remove the air in the resulting paste. The vacuum is then stopped and the resulting paste is compressed into a syringe where the components will mix within the syringe when the syringe is used.

Figure 3:
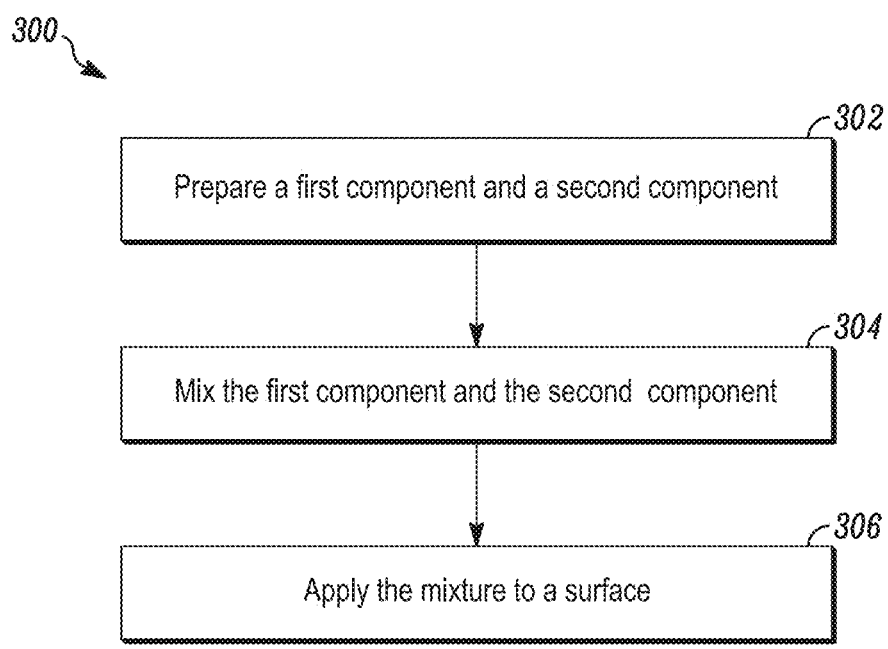
FIG. 3 is a flowchart relating to a method of preparing the thermal gel in accordance with the flowcharts of FIGS. 1 and 2.

Referring now to FIG. 3, a method 300 for preparing the thermal gel is provided. At step 302, a first component and a second component are prepared in accordance with methods 100 and 200, respectively. Then, at step 304, the first component and the second component are mixed together in a ratio (first component:second component) of as little 0.5:1, 0.75:1, 1:1, as great as 1.5:1, 1.75:1, 2:1, or within any range defined between any two of the foregoing values. A ratio (first component:second component) that is too large or too low can result in operating inconvenience when in use because the variation in weight of a smaller volume component may lead to greater variation of target weight ratio for inhibitor, catalyst, cross linking silicone oil, and/or other lower loading ingredients. In an exemplary embodiment, the first component and the second component are mixed in a 1:1 ratio by a static mixer.

After the first component and the second component are mixed, the resulting mixture is then applied onto a surface as indicated by step 306. The mixture can be applied by an automatic dispensing machine or a manual dispensing machine such as a syringe.

Figure 6:
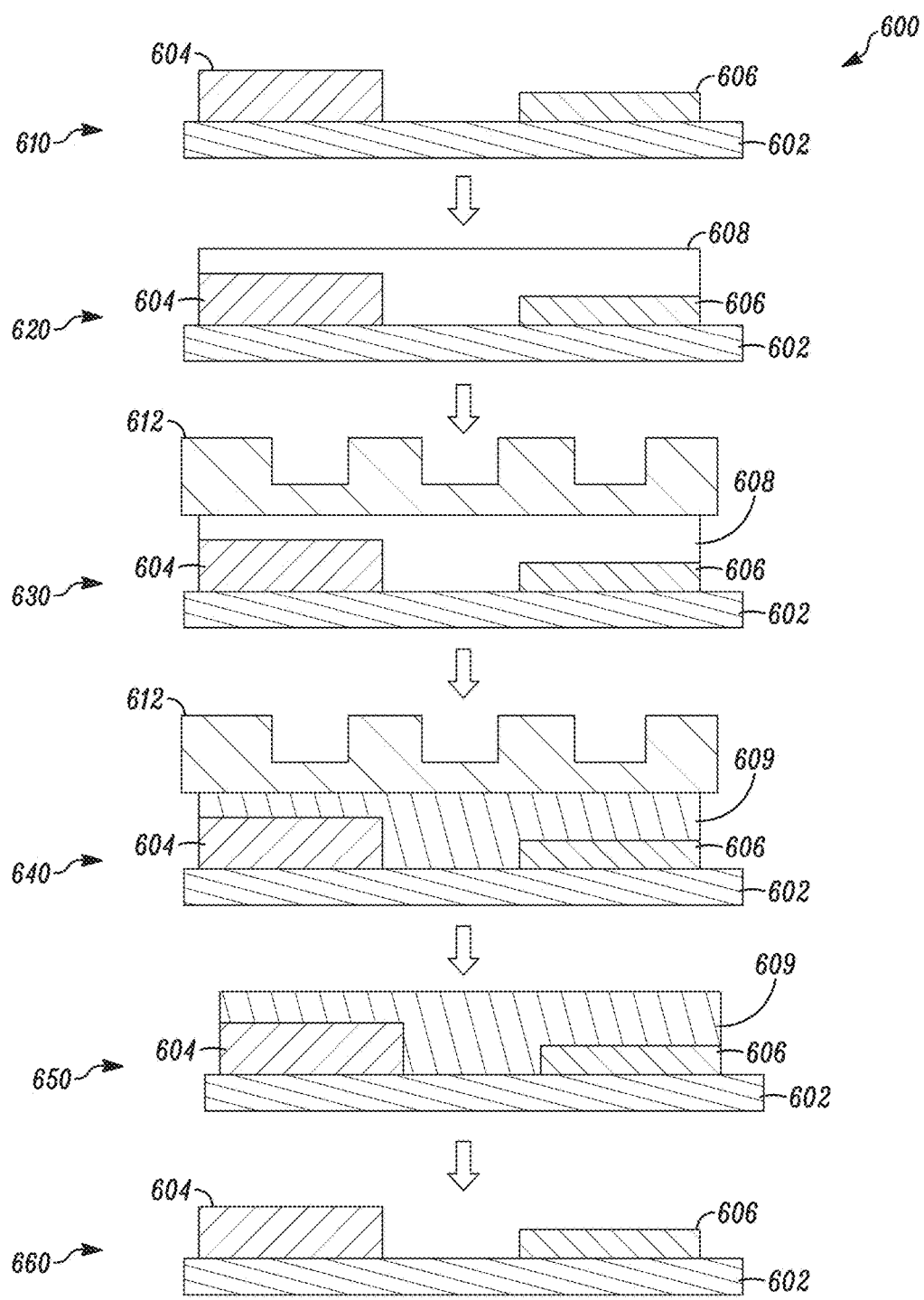
FIG. 6 illustrates a method of applying and removing the samples for an electronic device application.

FIG. 6 illustrates a method 600 of applying a thermal gel 608 prepared in accordance with FIGS. 1-3. As shown in step 610, a printed circuit board (PCB) 602 includes chips 604, 606. It is within the scope of the present disclosure that a greater or fewer number of chips may be provided on PCB 602. In step 620, thermal gel 608 is applied onto PCB 602 and chips 604, 606 via a manual dispensing or an automatic dispensing machine as discussed above. Thermal gel 608 is applied such that thermal gel 608 covers the upper surfaces of chips 604, 606. Once thermal gel 608 is applied, a heat sink 612 is applied onto thermal gel 608 as shown in step 630 while thermal gel 608 cures. Step 640 shows the final structure of the device once thermal gel 608 cures to form a thermal conductive composite 609.

When conductive thermal composite 609 needs to be reworked, thermal conductive composite 609 can be removed from the device as shown in method 600. To remove the thermal gel 608 from the device (from step 640), heat sink 612 is removed from thermal conductive composite 609 as shown in step 650. Then, as shown in step 660, thermal conductive composite 609 is removed (e.g., peeled off, FIG. 5A) from PCB 602 and chips 604, 606 to return the device to its original state. As discussed in greater detail herein, thermal conductive composite 609 is removed without residue left upon PCB 602 and chips 604, 606.

C. Properties of Thermal Gel

The thermal gel of the present disclosure can be mixed in about a 1:1 ratio between the first component and the second component. Advantageously, such a ratio provides ease of preparation/mixing to form the thermal gel. Furthermore, the mixing ratio provides for easy, accurate mixing of the components before the point of application. For example, preparation of the thermal gel can be more easily done in a batch process when the mixing ratio of the first component and the second component is 1:1 compared to a different mixing ratio.

The resulting thermal gel from methods 100, 200, and 300 can be automatically dispensed. The thermal gel cures in place while also being releasable or easily removed if the thermal gel needs to be reworked or reapplied onto the surface. Thus, the easy removal of the thermal gel provides reduced clean up time when the thermal gel needs to be reworked or reapplied.

Furthermore, as mentioned earlier, the thermal gel can cure in place. After assembly, the thermal gel can begin curing in around 2 hours and fully cure after 24 hours to 48 hours. Curing times depend on the temperature of the ambient environment. For example, electronic components that operate at a temperature of around 80° C. would result in a different curing time for the thermal gel than electronic components that operate at a different temperature.

The thermal gel of the present disclosure has a thermal conductivity of as little as 1 W/m·K, 1.5 W/m·K, or 2 W/m·K, or as great as 2.5 W/m·K, 3 W/m·K, or 4 W/m·K, or within any range defined between any two of the foregoing values, such as between 1 W/m·K and 4 W/m·K, 1.5 W/m·K to 3 W/m·K, or 2 W/m·K to 2.5 W/m·K. An exemplary thermal conductivity test method standard is ASTM D5470. In one exemplary embodiment, a thermal interface material as described above has the thermal conductivity of about 2.8 W/m·K.

EXAMPLES

Comparison of Comparative Example 1, Comparative Example 2, and Example 1

The thermal gel for Example 1 and comparative Example 1 was prepared according to the formulation shown in Table 1 and the description below. The thermal gel of comparative Example 2 is Gel30, commercially available from Parker-Chomerics.

TABLE 1

| Example 1 | | | | Comparative Example 1 | |
|---|---|---|---|---|---|
| First Component | | Second Component | | Single component | |
| Material | Weight (g) | Material | Weight (g) | Material | Weight (g) |
| Primary Silicone Oil | 50.625 | Primary Silicone Oil | 49.5 | Primary Silicone Oil | 100 |
| Inhibitor | 0.05 | Cross Linking Silicone Oil | 1.5 | Cross Linking Silicone Oil | 0.1 |
| Catalyst | 0.2 | 70 um Alumina | 250 | Inhibitor | 0.05 |
| 70 um Alumina | 250 | 5 um Alumina | 220.5 | Catalyst | 0.05 |
| 5 um Alumina | 220.5 | | | 70 um Alumina | 500 |
| Yellow pigment | 0.10 g | | | 5 um Alumina | 440 |

The thermal gel of Example 1 is a two-component system. The primary silicone oil is polydimethylsiloxane with vinyl groups, and the primary silicone oil has a kinematic viscosity of 2000 cSt. The cross-linking silicone oil of the second component of the thermal gel of Example 1 is copolymer of methylhydrogensiloxane-dimethylsiloxane; the cross-linking silicone oil having a kinematic viscosity 500 cSt. The ratio of total content of Si—H groups ($T_{Si-H}$) to total content of vinyl groups ($T_{vinyl}$) is 0.07. The first component and the second component were prepared according to methods 100 and 200, respectively. The first component and the second component were then mixed in a 1:1 ratio by a static mixer before applying the thermal gel of Example 1 onto a surface. The resulting thermal gel of Example 1 had a thermal conductivity of 3 W/m·K.

The thermal gel of Comparative Example 1 was prepared as single component system. The primary silicone oil is polydimethylsiloxane with vinyl groups; the primary silicone oil having a kinematic viscosity of 2000 cSt. The cross linking silicone oil of the thermal gel of Comparative Example 1 is a copolymer of methylhydrogensiloxane-dimethylsiloxane; the cross-linking silicone oil having a kinematic viscosity 500 cSt. The ratio of total content of Si—H groups ($T_{Si-H}$) to total content of vinyl groups ($T_{vinyl}$) is 0.005. The thermal gel of Comparative Example 2 was prepared as a single component system and is generally based on silicone oil with metal oxide (alumina) fillers.

Figure 5A:
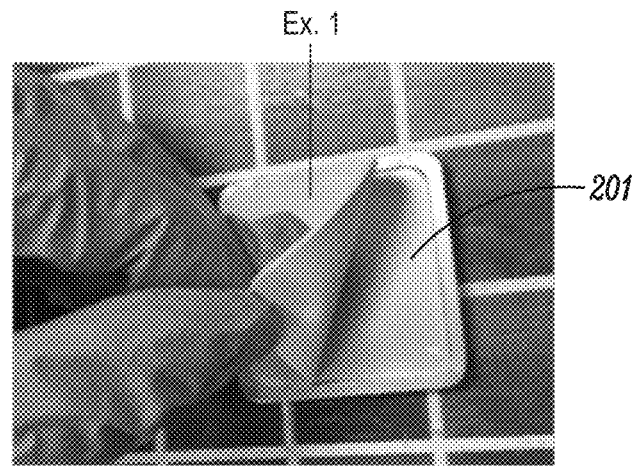
FIG. 5A is related to Example 1 and shows the sample as applied to a substrate and its removal from the substrate.
Figure 5B:
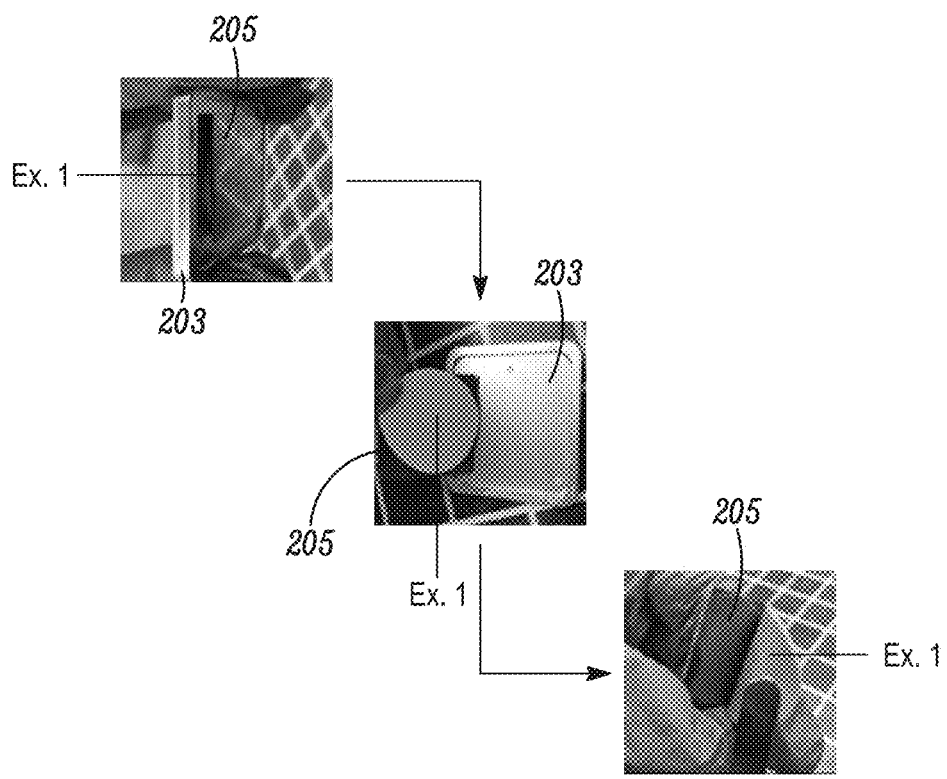
FIG. 5B is related to Example 1 and shows the sample as applied between a first substrate and a second substrate and its removal from the first substrate and the second substrate.

The thermal gel of Example 1 was then printed onto a heat spreader 201 as a 1 mm thick sheet as shown in FIG. 5A. As also shown in FIG. 5A, after curing, the sheet of Example 1 was easily removable from the heat spreader 201. Furthermore, the thermal gel of Example 1, was applied onto a heat spreader 203 as a dot pattern. The dot pattern of Example 1 was also compressed on the non-contacting side by a copper plate 205. As shown in FIG. 5B, after curing, the thermal gel of Ex. 1 easily released from both surfaces 203, 205.

Figure 4A:
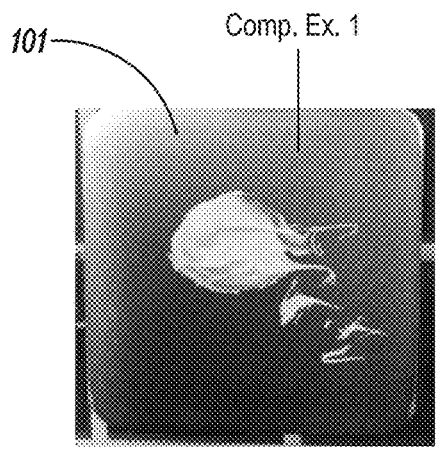
FIGS. 4A-4C are related to Comparative Example 1 and shows the sample as applied to a substrate and its removal from the substrate.
Figure 4B:
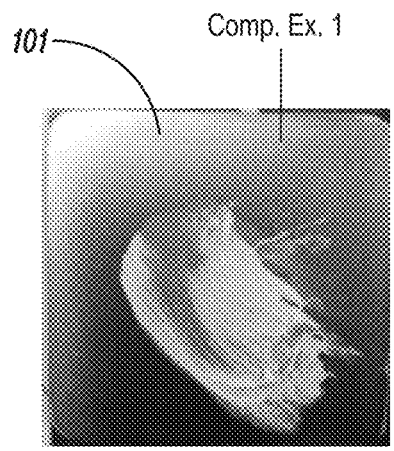
Figure 4C:
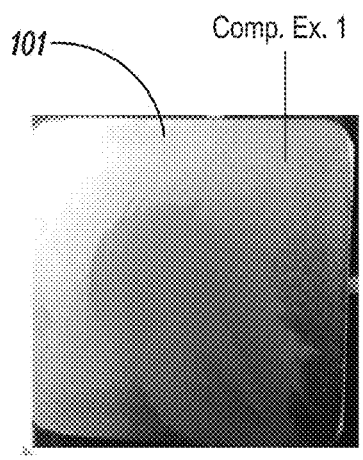

By contrast, as shown in FIG. 4A, the thermal gel of Comparative Example 1 is applied to a substrate 101, and as shown in FIGS. 4B and 4C, the applied thermal gel of Comparative Example 1 was not easily removable and smeared against substrate 101 unlike Example 1, which was easily removable.

Figure 4D:
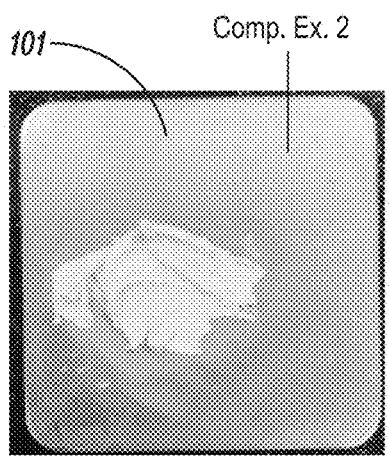
FIGS. 4D-4F are related to Comparative Example 2 and shows the sample as applied to a substrate and its removal from the substrate.
Figure 4E:
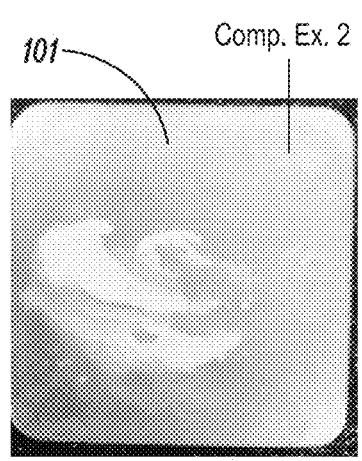
Figure 4F:
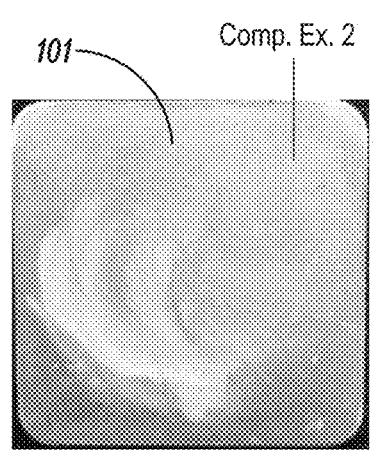

Also, as shown in FIG. 4D, the thermal gel of Comparative Example 2 is applied to a substrate 101, and as shown in FIGS. 4E and 4F, the applied thermal gel of Comparative Example 1 was not easily removable and smeared against substrate 101 unlike Example 1, which was easily removable.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A thermal gel comprising:
   a first component including:
      a primary silicone oil;
      an inhibitor;
      a catalyst; and
      at least one thermal conductive filler;
   a second component including:
      a primary silicone oil;
      a crosslinking silicone oil; and
      at least one thermal conductive filler;
   wherein the primary silicone oil of the first component is a vinyl silicone oil, the primary silicone oil of the second component is a vinyl silicone oil, and the crosslinking silicone oil of the second component is a hydrosilicone oil;
   wherein the thermal gel is releasable from a substrate upon which the thermal gel is applied;
   wherein the total content of the thermally conductive fillers in the thermal gel is between 75 wt. % and 95 wt. %; and
   wherein the weight ratio between the first component and the second component is between 0.5:1 and 2:1.

2. The thermal gel of claim 1, wherein the thermal gel cures in place at room temperature.

3. The thermal gel of claim 1, wherein the at least one thermally conductive filler for the first component and the second component each have an average particle size between 5 microns and 80 microns.

4. The thermal gel of claim 1, wherein the a ratio of a total content of Si—H groups of the crosslinking silicone oil to a total content of vinyl groups of the primary silicone oils is between 0.03 to 10.

5. The thermal gel of claim 1, wherein the concentration of the catalyst in the thermal gel is greater than 100 ppm.

6. The thermal gel of claim 1, wherein the primary silicone oil of the first component and the crosslinking silicone oil of the second component each have a kinematic viscosity greater than 1000 cSt.

7. The thermal gel of claim 1, wherein the thermal gel cures at a temperature between room temperature and 100° C.

8. The thermal gel of claim 1, wherein the viscosity of the first component is at least 100 Pa·s, and the viscosity of the second component is at least 100 Pa·s.

9. The thermal gel of claim 1, wherein the conductivity of the thermal gel is at least 2 W/m.K.

10. A thermal gel comprising:
a first component including:
a primary silicone oil;
an inhibitor;
a catalyst; and
at least one thermal conductive filler;
a second component including:
a primary silicone oil;
a crosslinking silicone oil; and
at least one thermal conductive filler;
wherein the primary silicone oil of the first component is a vinyl silicone oil, the primary silicone oil of the second component is a vinyl silicone oil, and the crosslinking silicone oil of the second component is a hydrosilicone oil;
wherein the thermal gel is releasable from a substrate upon which the thermal gel is applied;
wherein the total content of the thermally conductive fillers in the thermal gel is between 75 wt. % and 95 wt. %; and
wherein the catalyst is a Pt based catalyst with at least 2000 ppm weight loading in first component.

11. The thermal gel of claim 10, wherein a ratio of a total content of Si—H groups of the crosslinking silicone oil to a total content of vinyl groups of the primary silicone oils is between 0.03 to 10.

12. The thermal gel of claim 10, wherein the thermal gel cures in place at room temperature.

13. The thermal gel of claim 10, wherein the at least one thermally conductive filler for the first component and the second component each have an average particle size between 5 microns and 80 microns.

14. The thermal gel of claim 10, wherein the primary silicone oil of the first component and the crosslinking silicone oil of the second component each have a kinematic viscosity greater than 1000 cSt.

15. The thermal gel of claim 10, wherein the thermal gel cures at a temperature between room temperature and 100° C.

16. An electronic device comprising:
(I) at least two heat sources;
(II) a thermal conductive composite, cured from a thermal gel and applied onto the at least two heat sources, the thermal gel comprising:
a first component including:
a silicone oil;
an inhibitor;
a catalyst; and
at least one thermal conductive filler;
a second component including:
a first silicone oil;
a second silicone oil;
at least one thermal conductive filler;
wherein the silicone oil of the first component is a vinyl silicone oil, the first silicone oil of the second component is a vinyl silicone oil, and the second silicone oil of the second component is a hydrosilicone oil; and
(III) a heatsink or heat spreader applied onto the thermal conductive composite;
wherein the thermal gel is releasable from the at least two heat sources;
wherein the total content of the thermally conductive fillers in the thermal gel is between 75 wt. % and 95 wt. %; and
wherein the weight ratio between the first component and the second component is between 0.5:1 and 2:1.

17. The electronic device of claim 16, wherein the ratio of total content of Si—H groups of the second silicone oil to total content of vinyl groups of the silicone oil of the first component and the first silicone oil of the second component in the thermal gel is between 0.03 to 10.

18. The electronic device of claim 16, wherein the thermal conductive composite is cured at room temperature from the gel.

19. The electronic device of claim 16, wherein the thermal conductive composite is cured at a temperature between room temperature and 100° C. from the gel.

20. The thermal gel of claim 16, wherein the silicone oil of the first component and the first and second silicone oils of the second component each have a kinematic viscosity greater than 1000 cSt.

* * * * *